(12) United States Patent
Stoneking

(10) Patent No.: US 6,559,783 B1
(45) Date of Patent: May 6, 2003

(54) PROGRAMMABLE AUTO-CONVERTING ANALOG TO DIGITAL CONVERSION MODULE

(75) Inventor: Rick Stoneking, Mt. Holly, NJ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/639,841

(22) Filed: Aug. 16, 2000

(51) Int. Cl.[7] ............................................... H03M 3/00
(52) U.S. Cl. ........................ 341/141; 341/155; 341/156; 341/159; 341/160; 341/120
(58) Field of Search .................................. 341/141, 155, 341/156, 159, 120, 166; 709/102, 103, 107

(56) References Cited

U.S. PATENT DOCUMENTS

| | | | | |
|---|---|---|---|---|
| 4,758,948 A | * | 7/1988 | May et al. ................... | 709/102 |
| 4,783,743 A | * | 11/1988 | Yashiki et al. ................ | 701/64 |
| 5,111,203 A | * | 5/1992 | Calkins ....................... | 341/141 |
| 5,473,758 A | | 12/1995 | Allen et al. .................. | 211/143 |
| 5,541,601 A | * | 7/1996 | Goto et al. ................... | 341/141 |
| 5,736,949 A | * | 4/1998 | Ong et al. ................... | 341/141 |
| 5,854,454 A | | 12/1998 | Upender et al. ............ | 187/247 |

FOREIGN PATENT DOCUMENTS

| | | |
|---|---|---|
| EP | 0 474 024 A2 | 8/1991 |
| FR | 2 668 273 A1 | 10/1990 |

OTHER PUBLICATIONS

COP888EB 8–Bit CMOS ROM Based Microcontrollers with 8k Memory, CAN Interface, 8–Bit A/D, and USART, National Semiconductor Corporation, Sep. 1999, pp. 1–20.

Wenzel, Tobias, SLIO–CAN CAN–Linked I/O Based on COP884BC, National Semiconductor Corporation AN–1073, Jun. 1997, pp. 1–47.

TJA 1050 High Speed CAN Transceiver Preliminary specification data sheet, Sep. 27, 1999, pp. 1–16, Philips Semiconductor.

SJA 1000 Stand–alone CAN Controller, Product specification data sheet, Jan. 4, 2000, Philips Semiconductors, pp. 1–67.

* cited by examiner

Primary Examiner—Michael Tokar
Assistant Examiner—Lam T. Mai
(74) Attorney, Agent, or Firm—Swidler Berlin Shereff Friedman, LLP

(57) ABSTRACT

A method and device automatically convert a plurality of analog input channels using a single analog to digital conversion circuit. The device includes a multiplexer, an analog to digital conversion circuit and a configurable channel controller. The multiplexer has at least two analog input channels. The multiplexer also has control inputs and an output. The analog to digital conversion circuit is coupled to the output of the multiplexer and a clock signal. The analog to digital conversion circuit outputs a conversion value based on a voltage associated with the output of the multiplexer in successive clock cycles. The configurable channel controller outputs a control signal to the control inputs of the multiplexer to automatically select successive ones of the at least two analog input channels for conveying to the analog to digital conversion circuit.

13 Claims, 14 Drawing Sheets

PROGRAMMABLE AUTO-CONVERTING ANALOG TO DIGITAL CONVERSION MODULE

FIELD OF THE INVENTION

The present invention relates generally to analog to digital conversion and control systems and more particularly to programmable, configurable analog to digital conversion within a controller area network.

BACKGROUND OF THE INVENTION

Message-based networks are used in a variety of control networks. In a message-based network, all nodes within the network are connected to a common bus. Each node is also connected to peripheral devices and performs one or more functions. The functions may be, for example: monitoring conditions of peripheral devices, such as their electrical outputs, temperature, position or velocity; controlling and stimulating inputs to the peripheral devices; transmitting data messages concerning the peripheral devices over the common bus; and requesting data from other nodes over the common bus.

In a message-based network, messages are transmitted to all nodes in the network. Each node must then determine whether to accept and process a message or ignore the message. This is different from an address based network in which messages may be transmitted to a specific node based on the address of that node. The message-based communication between the nodes allows coordinated control of many control nodes within the system. Message types conventionally include data messages, remote data request messages, error messages and overload error messages.

Message-based networks are implemented in a wide variety of applications, including industrial automation, automotive/truck, medical equipment, test equipment and mobile machines. It will be appreciated that many of these networks are complex and require numerous nodes in order to control the numerous peripheral devices required to implement a system. For example, in an automobile application, hundreds of nodes may be required to monitor and control the engine, safety systems, security systems, sensors, signals, lights, buttons, electric motors, radio and other peripherals. For this reason, it is desirable to minimize the cost of each node.

Conventionally, it has been expensive to implement nodes in message-based networks. The expense has limited the range of applications to which message-based networks would otherwise be applied. The reasons for the high cost per node include that conventionally, relatively expensive devices such as microcontrollers are used to connect peripheral devices to the common bus. These devices often have much more processing capability than is required to control or monitor the peripheral devices.

There is a need for a new device for use in nodes of message-based networks. The device should be configurable allowing it to be implemented in a wide variety of applications to keep per unit costs of production low. There is still a further need for a device that includes an analog to digital converter (A/D) for converting analog inputs to digital values for transmission to the common bus. There is still a further need for a technique to minimize transmission of data messages carrying converted analog signal data. This is necessary to avoid congestion on a common message-based bus. There is still a further need for an A/D conversion module that makes efficient use of space and power on a device.

SUMMARY OF THE INVENTION

According to the present invention, an A/D conversion on a device is accomplished using fewer A/D conversion circuits than analog input channels. Signals from many analog input channels are time multiplexed and provided as a single input signal to each A/D conversion circuit. This avoids having to provide a dedicated A/D conversion circuit to each analog input channel on a device and therefore saves power and space on the device.

According to an embodiment of the present invention, a device automatically converts a plurality of analog input channels using a single analog to digital conversion circuit. The device includes a multiplexer, an analog to digital conversion circuit and a configurable channel controller. The multiplexer has at least two analog input channels. The multiplexer also has control inputs and an output. The analog to digital conversion circuit has inputs coupled to the output of the multiplexer and a clock signal. The analog to digital conversion circuit outputs a conversion value based on a voltage associated with the output of the multiplexer in successive clock cycles. The configurable channel controller outputs a control signal to the control inputs of the multiplexer to automatically select successive ones of the analog input channels for conveying to the analog to digital conversion circuit.

The configurable channel controller may have a configuration set based on values stored in one or more registers. The configuration may also include enable values that selectively enable each of the analog input channels for auto-conversion based on some of the values. In another embodiment, the configurable channel controller receives an interrupt signal to initiate outputting the control signal. In still another embodiment, the conversion value is output in successive clock cycles to registers where each register stores the converted value corresponding to the selected analog input channel. In still another embodiment, the device also includes comparators for comparing the converted value with a threshold value and a protocol engine for outputting a message when the converted value crosses the threshold value.

A method of automatic A/D conversion according to an embodiment of the present invention includes providing at least two analog input channels and periodically, successively selecting one of the analog input channels. A signal from the selected analog input channel is applied to an A/D conversion unit. The signal is then converted to a converted digital value. In one embodiment, a configuration stored in registers includes a period value corresponding to a period of the input channel selection. In another embodiment, each analog input channel may be enabled for periodic input channel selection based on enable values of the configuration. In still another embodiment, an interrupt signal initiates the periodic input channel selection. The method may also include storing the converted value and outputting the converted value to registers in successive clock cycles where each register stores the converted value corresponding to the selected analog input channel. In still another embodiment, the method further includes comparing the converted value with a threshold value and outputting a message over a message-based bus when the converted value crosses the threshold value.

The device and method according to the present invention may be incorporated within a cost effective node for connecting to a message-based bus. The configuration of the device and method may be set to a default configuration and then reconfigured on the fly via messages from the message-based bus. Using these features, it is possible to create 'standard' nodes that self configure on power up. The standard nodes can then be modified via the message-based bus as needed. These standard nodes can be mass produced and embodied in simple, cost effective devices thus significantly expanding the range of systems in which message-based networks such as the controller area network (CAN) can be implemented.

BRIEF DESCRIPTION OF THE DRAWINGS

The aforementioned features and advantages of the present invention will be more fully appreciated with reference to the following description and appended figures, in which.

DETAILED DESCRIPTION

The invention finds application in a message-based network in which nodes within the network are remotely configurable by network messages. Message-based networks may be used in, for example, communications or control networks and may be embodied in many different ways. In order to describe embodiments of the present invention, a network called a controller area network (CAN) is used as an illustrative example. CAN networks may be implemented in a wide variety of applications, including industrial automation, automotive/truck, medical equipment, test equipment and mobile machines.

Figure 1:
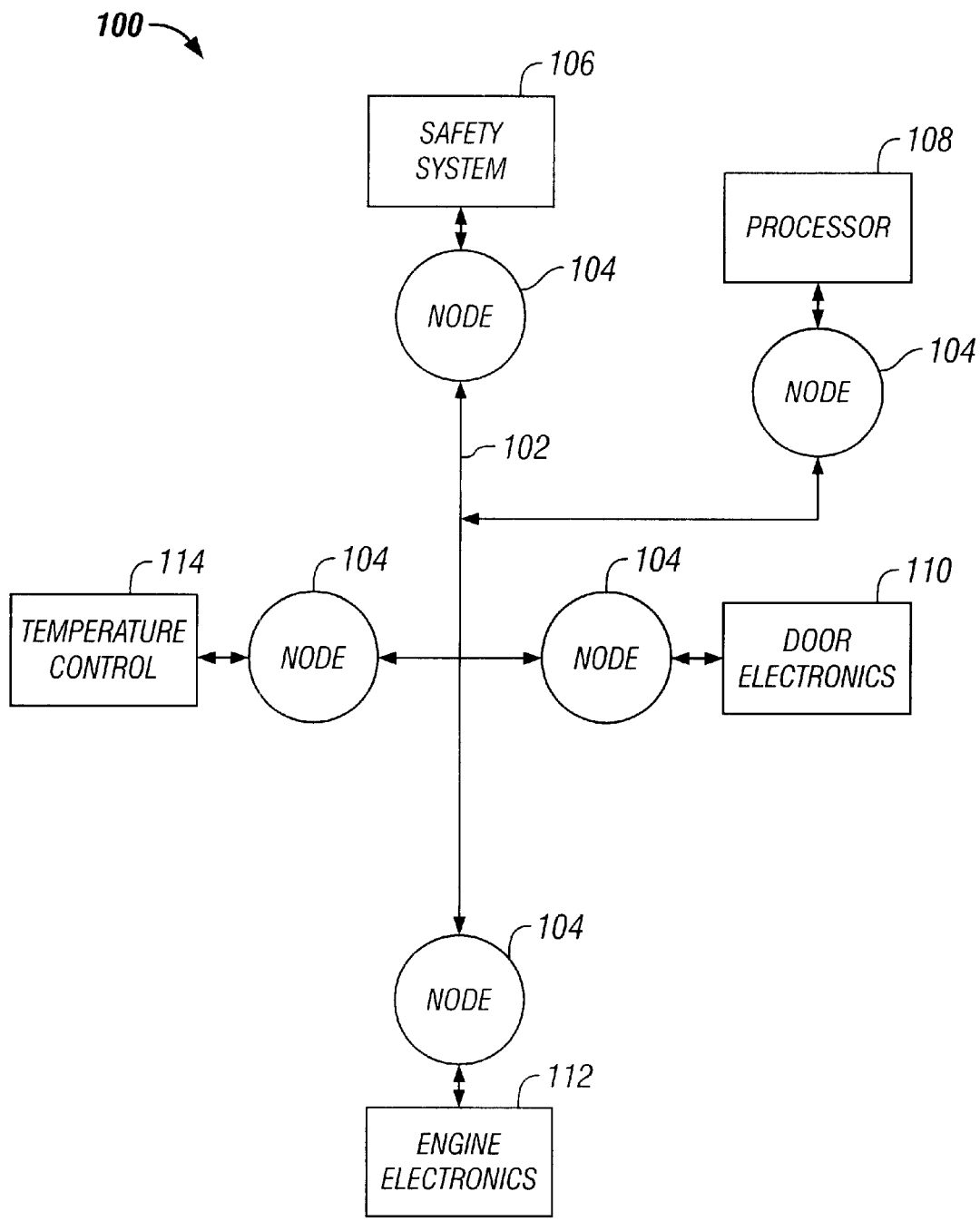
FIG. 1 depicts an illustrative message-based network according to the prior art.

FIG. 1 depicts a simple CAN network 100 to facilitate describing the invention. The CAN network 100 is implemented in an automobile for controlling various systems within the automobile. Referring to FIG. 1, the CAN network 100 includes a bus 102 interconnecting a plurality of nodes 104. The CAN network 100 may also include a processor 108 coupled to the bus 102, either directly or through interface electronics, for performing overall system control, node configuration, or other functions. Each node 104 is coupled to a respective system of the automobile. As shown in FIG. 1, these systems illustratively include a safety system 106, door electronics 110, engine electronics 112 and a temperature control system 114. It will be understood that in a typical automobile CAN network, numerous additional systems would be included and coupled to nodes 104 within the system.

Each of the nodes 104 monitors and/or controls a respective system in various ways. For example, an individual node 104 may receive a message from the bus 102 indicating that a particular feature of the attached system should be turned on or off. Alternatively, the node may passively monitor a condition of the attached system and communicate data about the condition to all other nodes in the CAN network 100 by transmitting messages over the bus. Many other modes of interaction between the configurable nodes, the bus, and the systems controlled are possible and described in more detail below.

CAN Embodiment Overview

CAN networks use a robust serial bus 102 to interconnect and communicate messages between the nodes 104. In order to interact with each other over the bus 102, each node 104 within a CAN network includes a CAN protocol engine which is capable of exchanging messages with the bus 102 according to the CAN protocol. The CAN protocol is a message-based protocol. This means that messages are not typically transmitted from one node to another node based on addresses. Rather, all nodes in the system receive every message transmitted on the bus (and will acknowledge if the message was properly received). It is up to each node 104 in the system to decide whether the message received should be immediately discarded or kept for processing.

Each message includes a message ID. In order to determine whether to process a received message, each node 104 examines the message ID from the message. Each node is configured to process messages whose message IDs meet predetermined criteria. These criteria may be, for example, that the message ID is one in a defined set, is within a certain numeric range or outside of a certain numeric range. If the extracted message ID meets the predetermined criteria, then the receiving node processes the message.

The CAN protocol defines four different types of messages: a data message, a remote message, an error message and an overload error message. The data message is used when a node transmits or receives information to or from any or all other nodes in the system. The remote message is a data message with a bit set to signify that it is a request for another node to transmit a data message. Error messages are generated by nodes that detect any one of the many protocol errors defined by CAN. Overload error messages are generated by nodes that require more time to process messages already received.

Figure 2A:
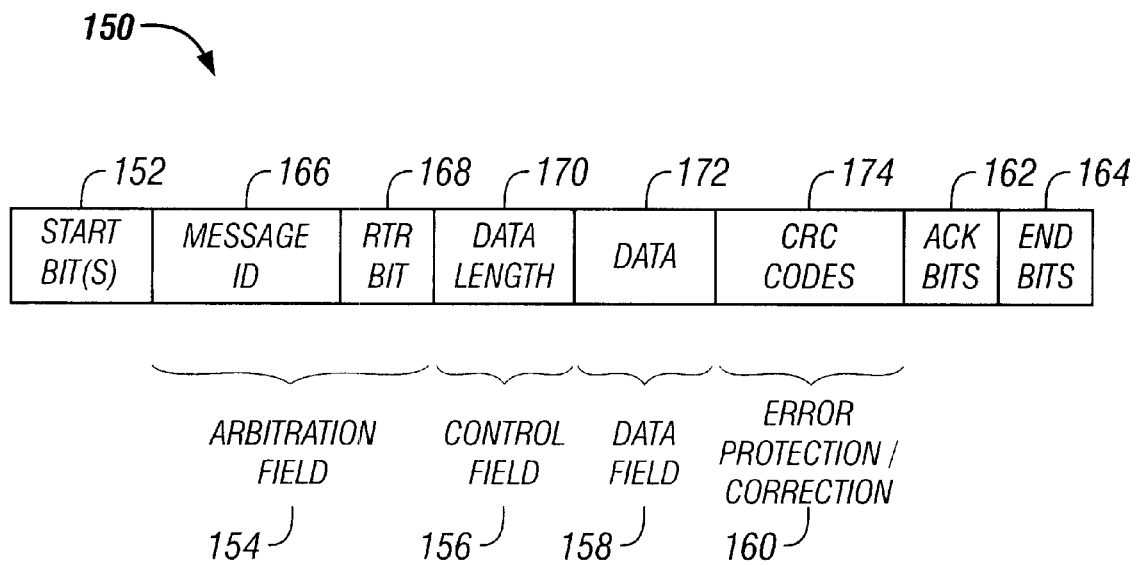
FIG. 2A depicts fields within a controller area network (CAN) message according to the prior art.

The anatomy of an exemplary CAN message 150 is illustrated in FIG. 2A. The message 150 includes a plurality of fields that define the message. This anatomy is illustrative in nature. It will be understood that any convenient fields and message format may be used depending on the particular implementation contemplated. Referring to FIG. 2A, embedded in the message is a start bit or bits 152, an arbitration field 154, a control field 156, a data field 158, an error protection field 160, an acknowledge field 162 and end of message bits 164.

The start bit or bits define the beginning of a message to nodes 104 on the bus 102. The arbitration field consists of a message ID 166 and a remote transmit request (RTR) bit 168. The RTR bit of the arbitration field specifies whether a message is a data message or an RTR message-based on whether it is a "0" or a "1." The message ID of the arbitration field does not typically specify the address of a node. Rather, it may specify a function, instruction or process that is recognized by at least one node 104 within the CAN network 100. Thus transmission of a message with a certain message ID over the bus 102 causes all nodes that perform a function, instruction or process related to that message ID to perform the appropriate function, instruction or process. Together, the numeric value of the message ID and the RTR bit define the priority of the message for purposes of message arbitration.

For message arbitration, the CAN protocol uses a Carrier Sense Multiple Access, collision detection ("CSMA/CD") scheme. It will be understood, however, that any arbitration scheme for determining the priority of messages is within the scope of the invention. A CSMA/CD scheme requires every node 104 on the bus 102 to monitor the bus for a period of no activity before trying to send a message 150 on the bus (Carrier Sense). Once this period of no activity occurs, every node 104 on the bus 102 has an equal opportunity to transmit a message 150 (Multiple Access). If two nodes 104 on the bus 102 start transmitting at the same time, the nodes 104 will detect the 'collision' and take the appropriate action. In the CAN protocol, a nondestruct bitwise arbitration method is utilized. This means that messages remain intact after arbitration is completed even if collisions occur or are detected. All of this arbitration takes place without corruption or delay of the higher priority message.

For message arbitration, the CAN protocol defines two states, one being dominant and the other being recessive. A dominant bit state will always win arbitration over a recessive bit state. For purposes of discussion, we assume that the dominant state is a logical 0 and the recessive state is a logical 1 as defined in the ISO 11898 specification. Given these definitions, the lower the number in the arbitration field, the higher priority the message has on the bus. For this reason, care should be taken in CAN to assign high priority messages a message ID with a lower numeric value than messages with a lower priority. Moreover, data messages are given priority over RTR messages by assigning the RTR bit value "0" to data messages and RTR bit value "1" to RTR messages.

As an example of a CAN arbitration, suppose two nodes 104 are trying to transmit a message at the same time. Each node 104 will monitor the bus 102 to make sure that the bit it is trying to send actually appears on the bus 102. The lower priority message will at some point try to send a recessive bit and the monitored state on the bus will be a dominant. At that point, the node with the lower priority message loses arbitration and immediately stops transmitting. The higher priority message will continue until completion and the node that lost arbitration will wait for the next period of no activity on the bus and try to transmit its message again.

Referring again to FIG. 2A, the control field 156 may include data specifying details about the message itself. For example, the control field 156 may include a bit specifying whether a messages is of standard or extended size. It may further include a data length field 170 specifying the number of data bits in the message. Additional bits may be included to specify other message details or modes of operation.

The data field 158 includes data bits 172 for transmitting data. The data bits 172 may specify, for example, an instruction or a value corresponding to a condition of a system being controlled by the CAN network 100. The error protection or correction field 160 includes, for example error protection codes or error correction codes such as a cyclic redundancy code ("CRC") 174. The CRC code 174 is determined based on the actual data 172 of the message 150 in a well known manner. The CRC code 174 is used by receiving nodes to determine if transmission errors have occurred.

The acknowledge field 162 is utilized to indicate if the message was received correctly. Any node that has correctly received the message, regardless of whether the node processes or discards the data, puts a dominant bit on the bus in the ACK slot bit time. Each transmitting node also outputs end bits to the bus 102 which define the end of the message.

A single message can be destined for one particular node to receive, or many nodes based on the way the network and system are designed. For example, an automotive airbag sensor can be connected via CAN to a safety system router node only. This router node takes in other safety system information and routes it to all other nodes on the safety system network. Then all the other nodes on the safety system network can receive the latest airbag sensor information from the router at the same time, acknowledge if the message was received properly, and decide whether to utilize this information or discard it. Another useful feature built into the CAN protocol is the ability for a node to request information from other nodes. This is called a Remote Transmit Request (RTR). This is different from the example in the previous paragraph because instead of waiting for information to be sent by a particular node, this node specifically requests data to be sent to it.

For example, a safety system 106 in a car gets frequent updates from critical sensors like the airbags, but it may not receive frequent updates from other sensors like the oil pressure sensor or the low battery sensor to make sure they are functioning properly. Periodically, the safety system 106 can request data from these other sensors and perform a thorough safety system check. The system designer can utilize this feature to minimize network traffic while still maintaining the integrity of the network. One additional benefit of this message-based protocol is that additional nodes can be added to the system without the necessity to reprogram all other nodes to recognize this addition.

Programmable Device Operation Control to Allow Commands

In an alternate embodiment of the invention, the efficiencies gained by remote transmit request messages described above are further enhanced by providing a new remote transmit request message format that includes a command field for embedding commands. Remote transmit request messages do not include data. Therefore, they are short and efficient to send over the bus 102. Remote transmit request messages with the new format may be used to maximize the efficiency of transmitting commands to nodes 104 within a CAN.

Figure 2B:
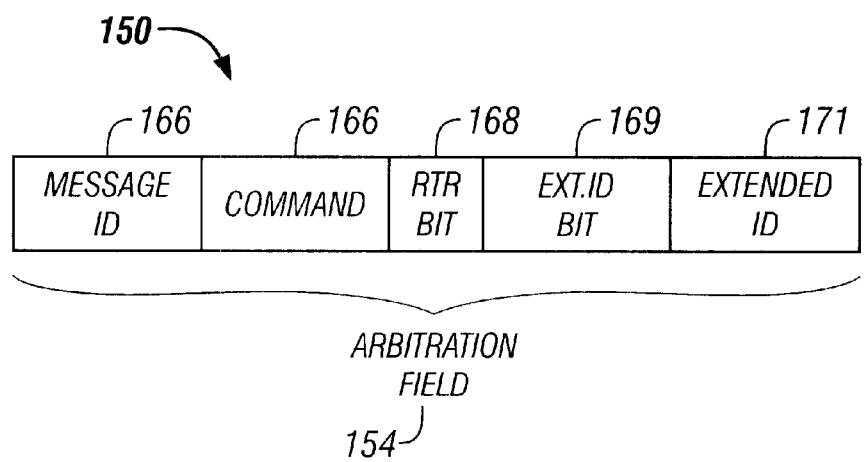
FIG. 2B depicts fields within a controller area network (CAN) message according to an embodiment of the present invention.

To send commands, the format of the message itself is changed so that the arbitration field of the message includes not only a message identifier, but also a command. This is shown in FIG. 2B where the arbitration field 154 of the message 150 is shown to include a command 166 in addition to the message ID 166 and the RTR bit 168. The arbitration field 154 may further include an extended ID bit 169 indicating the presence of additional bits in the arbitration field 154 in the form of an extended ID field which becomes part of the message 150 when the extended ID bit is set to the appropriate value.

A controller area network may be configured to operate with messages having a command in the arbitration field. The messages are transmitted over the bus 102 to the nodes 104. The messages have a message ID 166 in the arbitration field 154 for identifying functions performed by one or more nodes 104 of the controller area network. The arbitration field 154 further includes a command field for specifying a command for execution by nodes 104. The message ID 166 is situated before the command 166 in the message so that arbitration among messages is governed foremost by the message ID, not the command. Moreover, nodes receiving messages including a command 166 in the arbitration field 154 first determine, based on the message ID 166, whether to process the message. If a particular node 104 receives a message with a message ID that it is not configured to process, it will not process the message and therefore will not execute the command 166 within the message. If, however, a node 104 receives a message with a message ID 166 that it is configured to process, the node 104 will process the message, extract the command and execute the command.

Commands may include, for example, register read commands, register write commands, or commands to perform other operations that are not necessarily specified by the message ID 166 of the messages. In addition, the extended ID bit 169 may be used to add an extended ID to the arbitration field 171. The extended ID may be used, for example, to store an operand for a command 166 within a message. An example of this operation is a command sent to read a particular memory location within the node 104. Such a message may be sent, for example, with a message ID that identifies particular nodes 104, a command to read a memory location within the particular nodes, the extended ID bit set. Moreover, within the extended ID field 168, data may be placed representing an address of the memory location within the particular nodes 104 desired to be read. Thus, the extended ID field may be used to store data that specifies which register within the memory or which memory location should be read as a result of executing a read memory command. With more complex commands, the extended ID field may be used to store operands for program instructions, such as: add, subtract, multiply, divide and jump.

Illustrative CAN Node Configurations

Figure 3:
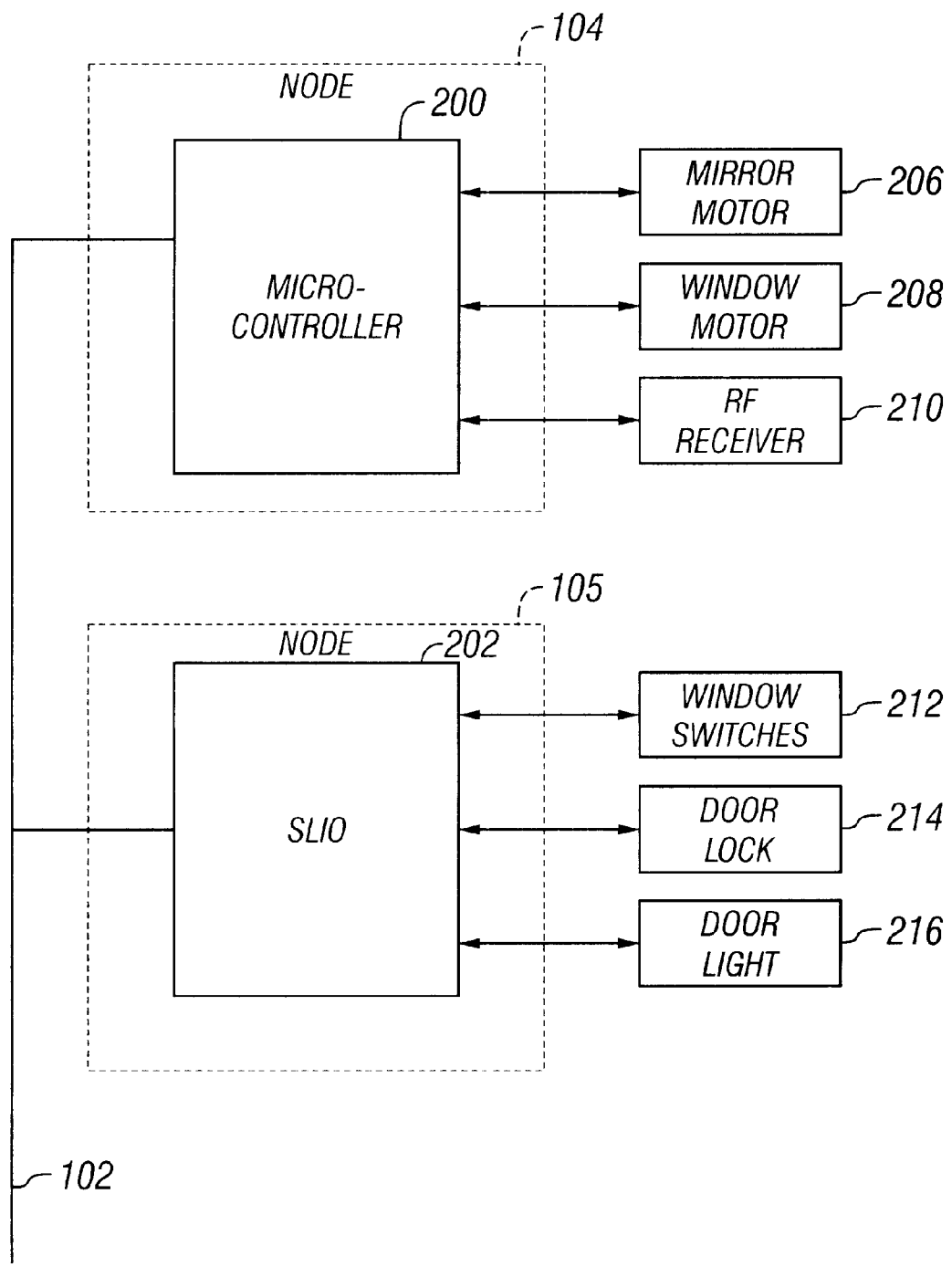
FIG. 3 depicts an illustrative node configuration according to an embodiment of the present invention.

FIG. 3 depicts a node configuration according to an embodiment of the present invention in which nodes 104 and 105 are shown coupled to the door electronics 110. Referring to FIG. 3, node 104 includes a microcontroller 200 and node 105 includes a serial linked input output (SLIO) device 202. The microcontroller 200 and the SLIO 202 are both coupled to the CAN bus 102 and exchange messages with the bus 102. Both the microcontroller 200 and the SLIO may be thought of as nodes within the CAN network 100. In general, microcontrollers may be implemented in a node to connect components of a system that require sophisticated control or processing. SLIO devices may be implemented in a node to connect to components of a system that require monitoring or less sophisticated control or processing.

The door electronics 110 include a mirror motor 206, a window motor 208, a RF receiver 210 which are coupled to the microcontroller 200. Each of these components of the door electronics requires sophisticated control or processing. The door electronics 110 further include components that are relatively simple to monitor and control, including window and mirror switches 212, a door lock 214 and a door light 216.

In order to control a door window, for example, the SLIO 202 may respond to a window switch being pressed to raise a window. In response, the SLIO 202 may transmit a data message over the bus 102 to the microcontroller 200 having a message ID that identifies the function of raising the window. The data message is received by all nodes on the bus 102, including the microcontroller 200. The microcontroller processes the message because the message ID corresponds to a function that the microcontroller was configured to perform. In response, the microcontroller 200 actuates the window motor 208 to raise the window. The microcontroller may monitor various motor parameters during raising of the window, including the position of the motor, speed of the motor and pressure on the motor. The latter processing is important to avoid injuring someone who may have caught an appendage between the window and door frame. All of these motor control functions require the sophisticated processing of the microcontroller 200. When an operator releases the window switch, the SLIO transmits a data message indicating that the window switch has been released. This message is also received and processed by the microcontroller 200 which stops the window motor 208.

Figure 4:
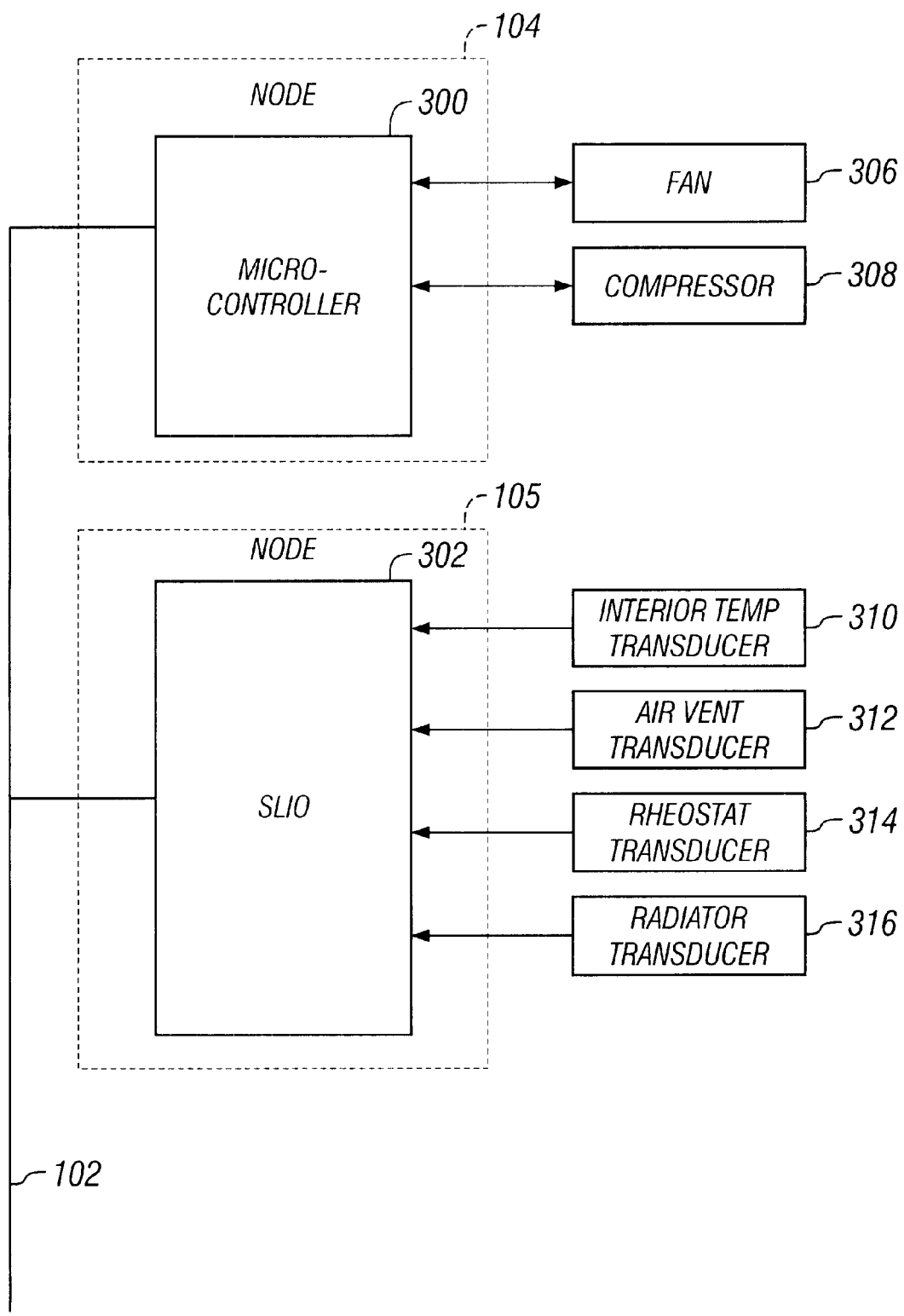
FIG. 4 depicts another illustrative node configuration according to an embodiment of the present invention.

FIG. 4 depicts another node configuration in which a microcontroller 200 and a SLIO 202 are coupled between the bus 102 and a temperature control system 114. The microcontroller is coupled to a fan 306 and a compressor 308 and turns them on and off and varies their output level under program control to maintain a desired temperature in the interior of the car. The SLIO device is coupled to: an interior temperature transducer 310 which measures the air temperature in the car; an air vent transducer 312 which measures the temperature of the air coming out of the vent; a rheostat transducer 314 which measures the current temperature setting; and a radiator transducer 316 which measures the temperature of the radiator which heats air destined for the car interior during a heating mode. Each of these transducers outputs an analog signal to the SLIO. The SLIO then converts the analog signal to a digital value. The digital values of all of the temperatures measured by the SLIO are transmitted in data messages to the microcontroller 200 over the bus 102. The data messages may be transmitted in desired intervals or in response to a data frame or remote transmit request. The microcontroller uses the temperature data from the data messages to determine control signals for the fan 306 and/or the compressor 308 to maintain a desired temperature inside of the car.

SLIO Embodiments

Figure 5:
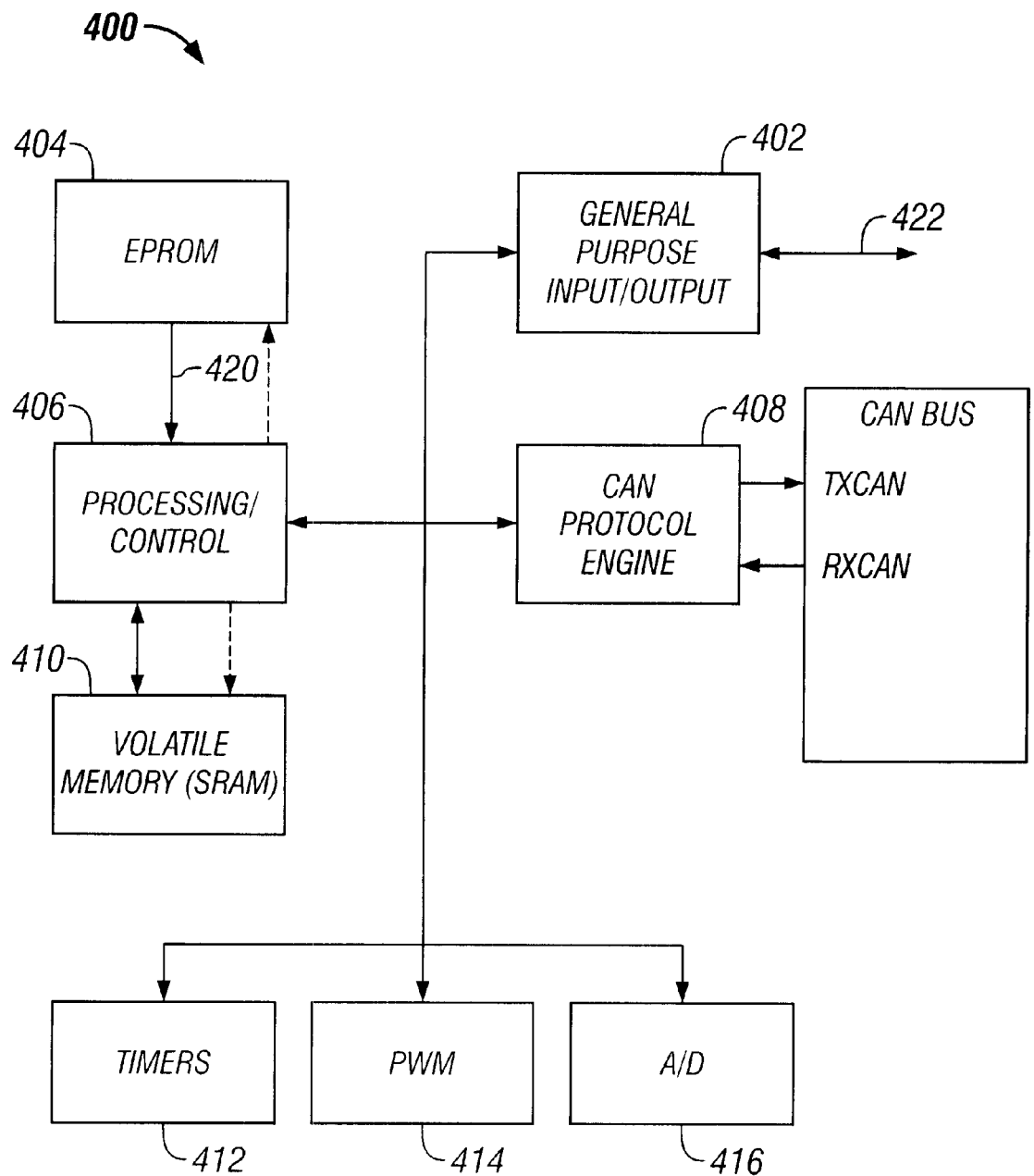
FIG. 5 depicts an internal view of a configurable device for connecting peripheral devices to a common CAN bus according to an embodiment of the present invention.

A functional block diagram of a SLIO device according to an embodiment of the present invention is shown in FIG. 5. Referring to FIG. 5, the SLIO 400 includes a general purpose input/output (GPIO) unit 402, a non-volatile memory implemented as an electrically programmable read only memory (EPROM) 404, a processing/control unit 406, a CAN protocol engine 408, a volatile memory 410, timers 412, a pulse width modulation (PWM) unit 414, and an analog to digital converter (A/D) 416. Each of these modules may be coupled together over a bus 418. The EPROM is also coupled to the processing/control unit over line 420 and has a separate coupling for address and control signals. The volatile memory 410 may also be coupled to the processing/control unit via separate data and control and address lines as shown. Each module and interactions between the modules are described below in more detail.

In one embodiment, the GPIO 402 has eight configurable input/outputs 422 that are connected to eight pins of the device 400 for communicating with systems, such as the door electronics 110 or the temperature control system 114. The inputs/outputs 422 may, for example, use TTL input levels and CMOS outputs. Some of the inputs 422 may be input only, while others may be configurable for input or output. The configuration of each pin as an input or output may be stored in a register, for example, a data direction register (DDR) within the memory 404 and/or 410. Setting a DDR register bit, for example, puts the corresponding output driver in a high-impedance mode. Clearing a bit in the DDR register, for example, puts the contents of the output latch on the selected pin(s). Each of the GPIO inputs/outputs 422 may have a weak internal pull-up resistor with a single control bit configurable to turn on all the pull-ups. The weak pull-up resistors may be automatically turned off when an input/output 422 is configured as an output or during a Power-on Reset of the device 400.

For maximum flexibility, some or all of the input/outputs 422 may be multiplexed with an alternate function. For example, inputs may be configured to: receive analog or digital signals; receive analog Vref inputs on one or more pins; output pulse width modulation (PWM) signals on one or more pins; output a clock signal; or input an external reset signal. The operation of each pin is selected by clearing or setting control bits in control registers that are part of the memory 410. An example of an arrangement of eight GPIO configurable input/outputs 422 is:

PIN 0: I/O or analog input
PIN 1: I/O or analog input
PIN 2: I/O, analog input, or PWM out
PIN 3: I/O, analog input, or PWM out
PIN4: I/O or analog voltage reference (Vref+)
PIN5: I/O or analog voltage reference (Vref−)
PIN 6: I/O or Clock output
PIN 7: Input, external reset input, or programming voltage input All GPIO pins may include a "transmit on change-of-state" feature that will automatically transmit a message over the CAN bus when an edge occurs on any of the digital inputs, or when any of the analog channels goes above or below a programmable comparator limit. A control register may be used to configure and enable inputs for this function.

The processing/control unit 406 may be implemented in many ways including using a CPU core or a state machine. Its main function is to perform all CAN bus decision making (i.e. filtering and interpreting messages, etc.), handle peripheral control, and pass data between the modules 402–420 and between the device 400 and the CAN bus. Firmware may be implemented to carry out the peripheral control functions and CAN bus operations. The firmware comprises program instructions executable by the processing/control unit 406 and control/configuration registers. The firmware is programmed into the EPROM 404 of the device 400 using, for example, in-line serial programming. The configuration registers may be programmed, for example, with a default configuration. The default configuration may then be transferred to from non-volatile memory to volatile memory upon Power-on Reset (POR) or an external reset signal, allowing a default configuration to be stored as an alterable configuration in volatile memory. According to the present invention, the alterable configuration may be accessed and modified via the CAN after power-up, thus creating a device that is configurable over the CAN bus.

The processing/control unit 406 may further include a program counter (PC) capable of addressing either the non-volatile or volatile memory to read the program instructions for execution by the processing/control unit 406. The processing/control unit 406 may further include interrupt capability, a hardware stack, a power-up timer (PWRT), oscillator start-up Timer (OST), a power saving SLEEP mode and selectable oscillator options.

The non-volatile memory 404 may be any volatile memory including but not limited to ROM, EPROM, EEPROM, flash memory, and magnetically or optically readable memory or memory devices. The non-volatile memory 404 is typically an electrically programmable read only memory (EPROM). It stores program instructions and configuration/control register values that are used to configure and control the modules 402–420 of the device 400. It may also be implemented as a ROM or any other readable non-volatile storage device.

The volatile memory 410 may be any type of volatile memory including, but not limited to, static or dynamic random access memory (SRAM or DRAM), latches, registers, register files. The volatile memory 410 may include program instructions, configuration/control registers, and general purpose registers. The configuration/control register are used to store values that configure and control the modules 402–420 of the device 400. These values are initially a copy of the corresponding register values stored as the default configuration in the non-volatile memory 404. However, according to the present invention, the values in the configuration/control registers may be updated or changed over the CAN bus during operation of the device 400 to dynamically change the configuration of the device 400. The general purpose registers store general purpose data that does not necessarily relate to configuration or control of the device 400. The volatile memory 410 may be implemented as static or dynamic random access memory (SRAM or DRAM) or any other convenient type of storage.

The CAN protocol engine 408 converts between raw digital data and CAN message packets. It comprises the protocol engine itself for interacting with the CAN bus and implementing the CAN protocol. It also includes one or more buffers, masks and filters. For example, the device 400 may include receive buffers, at least one acceptance mask and at least one filter.

The mask defines a bit pattern associated with a message ID that either should be accepted or rejected. The mask bits are applied to filters which then perform the function of accepting or rejecting an incoming message-based on whether the message ID of the message meets a predetermined criteria defined by the mask.

In general, it is advantageous to include at least one filter for each receive buffer. The device 400 may also include prioritized transmit buffers, a low power sleep mode and an automatic wake-up function on bus traffic and error management logic for transmit and receive error states.

The CAN protocol engine 408 may be implemented in a well known manner. In an illustrative implementation, the protocol engine includes a Finite State Machine (FSM), one or more shift registers, a cyclic redundancy check register, error management logic and bit timing logic for communicating with the CAN bus and implementing the CAN protocol.

The Cyclic Redundancy Check Register generates the Cyclic Redundancy Check (CRC) code which is transmitted after either the Control Field (for messages with 0 data bytes) or the Data Field, and is used to check the CRC field of incoming messages.

The Error Management Logic is responsible for the fault confinement of the CAN device. Its two counters, the Receive Error Counter (REC) and the Transmit Error Counter (TEC), are incremented and decremented by commands from the Bit Stream Processor. According to the values of the error counters, the device may be set into the states error-active, error-passive, or bus-off.

The Bit Timing Logic (BTL) monitors the bus line input and handles the bus related bit timing according to the CAN protocol. The BTL synchronizes on a recessive to dominant bus transition at Start of Frame (hard synchronization) and on any further recessive to dominant bus line transition if the CAN controller itself does not transmit a dominant bit (resynchronization). The BTL also provides programmable time segments to compensate for the propagation delay time, phase shifts, and to define the position of the Sample Point within the bit time. The programming of the BTL depends upon the baud rate and external physical delay times.

The FSM sequences through messages on a bit by bit basis, changing states as the fields of the various message types are transmitted or received. The FSM is a sequencer controlling the sequential data stream between a transmit/receive shift register, the CRC Register, and the bus line. The FSM also controls the Error Management Logic (EML) and the parallel data stream between the transmit and receive shift registers and the buffers. The FSM insures that the processes of reception, arbitration, transmission, and error signaling are performed according to the CAN protocol. The automatic retransmission of messages on the bus line is also handled by the FSM.

The Pulse Width Modulation (PWM) module 414 may include one or more individual PWM modules. In a preferred embodiment, two PWM modules are included. Each generates up to a 10-bit resolution output signal for output via the GPIO unit. Each of these outputs can be separately enabled, and each has its own associated timer, duty cycle, and period registers for controlling the PWM output shape. A PWM output has a time base (period) and a time that the output stays high (duty cycle). The frequency of the PWM is the inverse of the period (1/period).

The analog-to-digital (A/D) module 416 may include multiple channels for processing analog signals received on multiple analog configured GPIO inputs 422. In a preferred embodiment, the A/D module 416 comprises a four channel, 12-bit successive approximation A/D converter and allows conversion of an analog input signal to a corresponding 12-bit number.

The four analog input channels from the GPIO pins may be multiplexed into a single analog to digital converter. Each channel may be individually enabled. Voltage references Vref+ and Vref− sources may be brought into the A/D converter via two GPIO inputs 422 and are programmable via a control register. The A/D module can also be completely disabled via a control register bit.

The result of an A/D conversion is stored in channel registers. There may be many A/D channel registers to store and/or buffer results for specific analog channels. In a preferred embodiment, there are six A/D channel registers supporting four analog channels. For each analog channel, control registers store bits that configure or control the mode of operation. The modes of operation include auto-conversion and conversion-on-request. The auto conversion mode according to the present invention is described with reference to FIGS. 10–11B. In the conversion-on-request mode the device performs an A/D conversion only after receiving a "Read A/D Registers" information request message from the CAN bus. In this case, all of the GPIO inputs/outputs 422 that have been configured as analog input channels will be read and converted by the A/D converter 416. Subsequently the result for each analog channel is stored in a register and outputted as a data message over the CAN bus. A/D channels may be configured for transmit on input change mode. If this configuration is in effect, the A/D channel result(s) can be compared to a value stored in an associated A/D channel register. If the value in the analog channel result registers is lower or higher than the value in the A/D comparator registers, then a transmit flag register is set. A "transmit on change" message is then sent over the CAN bus if one or more flags are set. The transmit on change mode is described in more detail with reference to FIGS. 8–9.

Configuration of a Node

Figure 6:
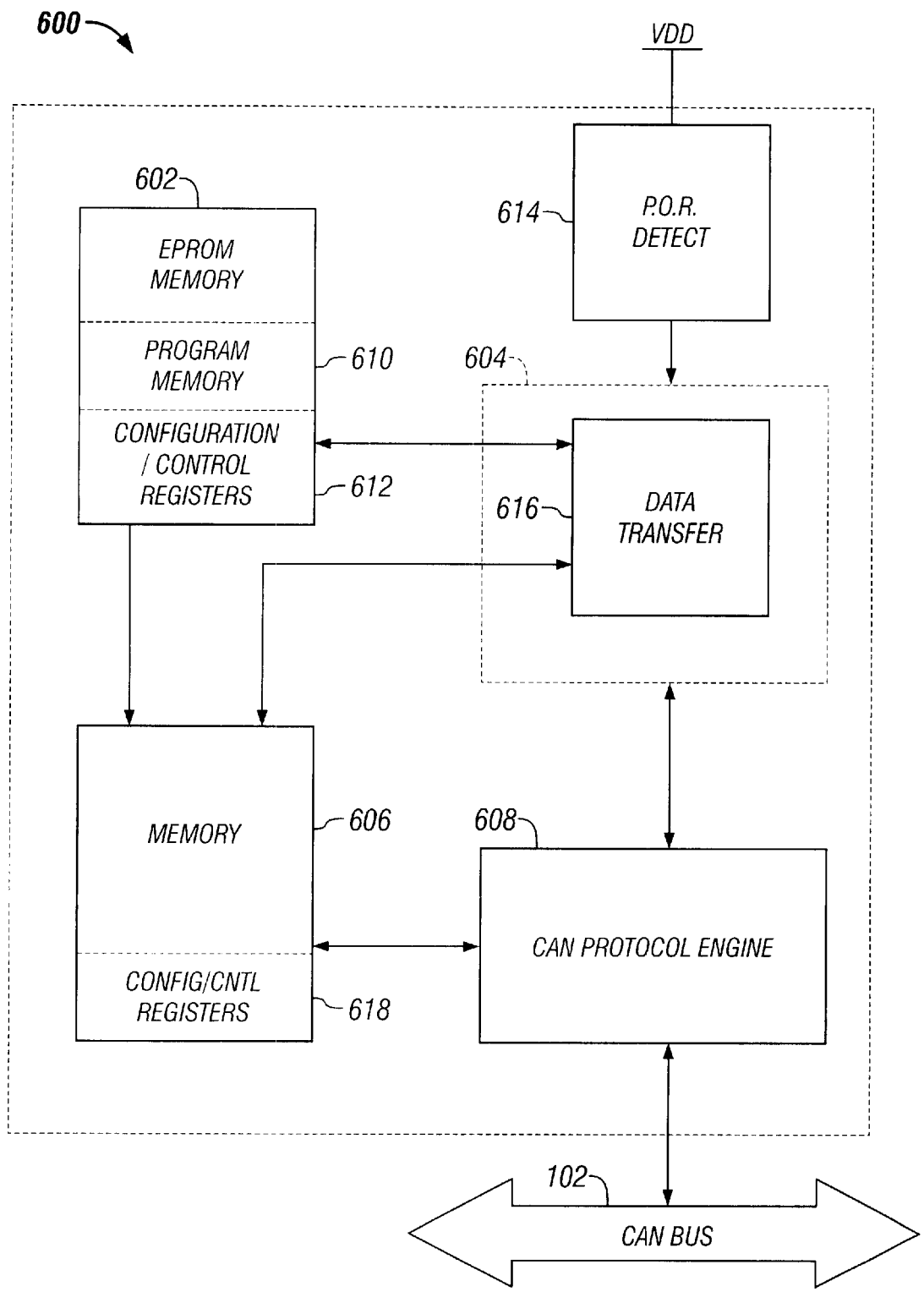
FIG. 6 depicts an internal view of a configurable device for receiving a default configuration via an EPROM and updated configurations via a message-based bus according to an embodiment of the present invention.

FIG. 6 depicts a functional view of modules within a device 600 that are associated with configuring the device. The device includes an EPROM 602, a control/processing unit 604, a memory 606 and a CAN protocol engine 608. The EPROM 602 includes a program memory space 610 and configuration/control register memory space 612. The program memory space 610 stores program instructions executable by the processing/control unit 604 as described above with respect to the SLIO embodiment. The configuration/control register memory space 602 stores values for control/configuration registers associated with control logic in other modules within the device 600. These modules illustratively include the modules 402–416 described with reference to the SLIO shown in FIG. 5. Examples of specific configuration and control registers are discussed above with respect to the SLIO embodiment.

The program instructions and configuration/control register values may be programmed into the SLIO during manufacture of the device or while the device is attached within a system by the user. Alternatively, programming may be done using a programming device after manufacture but prior to attaching the device within the system.

The control/processing unit is coupled to the EPROM 602, a source of power and a power on power on reset (POR) detect unit 614. The control/processing unit includes a data transfer unit 616 portion that facilitates transferring data from the EPROM 602 to the volatile memory 606. Upon application of power to the device 600, the POR detect unit 614 detects a rise in voltage across the device 600 and, in response, generates a configuration signal to the control/processing unit. The control/processing unit receives the configuration signal and may hold the control/processing unit in reset for a period of time so that Vdd rises to an acceptable level. After the period of time expires, control/processing unit sends address and control signals to the EPROM 602 and the memory 606 causing the configuration/control registers 612 of the EPROM 602 to fill appropriate configuration/control registers 618 within the volatile memory 606. In some implementations it may be desirable to also transfer program instructions from the program memory 610 to the appropriate space within the memory 606.

Once data from the EPROM has been transferred to the memory 606, the device is configured according to the "default" configuration programmed into the device either during manufacture or subsequent EPROM programming. According to the present invention, the default configuration becomes an alterable configuration once stored in the volatile memory. The alterable configuration may be changed during operation of the device 600 to maximize flexibility of implementing the device in particular message-based networks. In particular, a configuration message may be exchanged over the bus 102 with the device 600. The configuration message may be used to read and write configuration/control registers within the memory 606. This allows the configuration of the device 600 to be changed on the fly during implementation within a message-based network. This feature may be used at any time, however, it is likely to be most profitably implemented to configure devices 600 within a system immediately after powering up or resetting the system.

The configuration message must include indicia that make it recognizable as a configuration message. There are many ways of doing this. A configuration message bit may be included in a message and toggled on when a particular message is a configuration message. Alternatively, the message identifier itself may be used to indicate a configuration message. In any event, the configuration message must include an identifier that will be accepted as a configuration message for processing by the device 600 that one seeks to configure.

According to one embodiment of the invention, the least significant bits of the message ID are used to identify the configuration/control register 618 for reading/writing. Upon receipt of a configuration message, the CAN protocol engine receives the configuration message and accepts it for processing as a configuration message-based on its message ID and possibly other bits within the message. The message is then conveyed to the processing/control unit 604 for processing. In the case of a configuration message that writes data values, the values from the configuration message are written into the configuration/control registers 618 identified by the least significant bits of the message ID. In the case of a configuration message that reads values, the message is processed by the processing/control unit 604 to read the registers identified by the least significant bits of the configuration message. In response, a new message is generated and transmitted over the bus 102 by way of the CAN protocol engine 608. The new message includes values of one or more configuration/control as read out of the memory 606. The ability to read and write the configuration/control registers 618 affords great flexibility to change the default configuration of and reconfigure nodes within a message-based network dynamically.

Figure 7A:
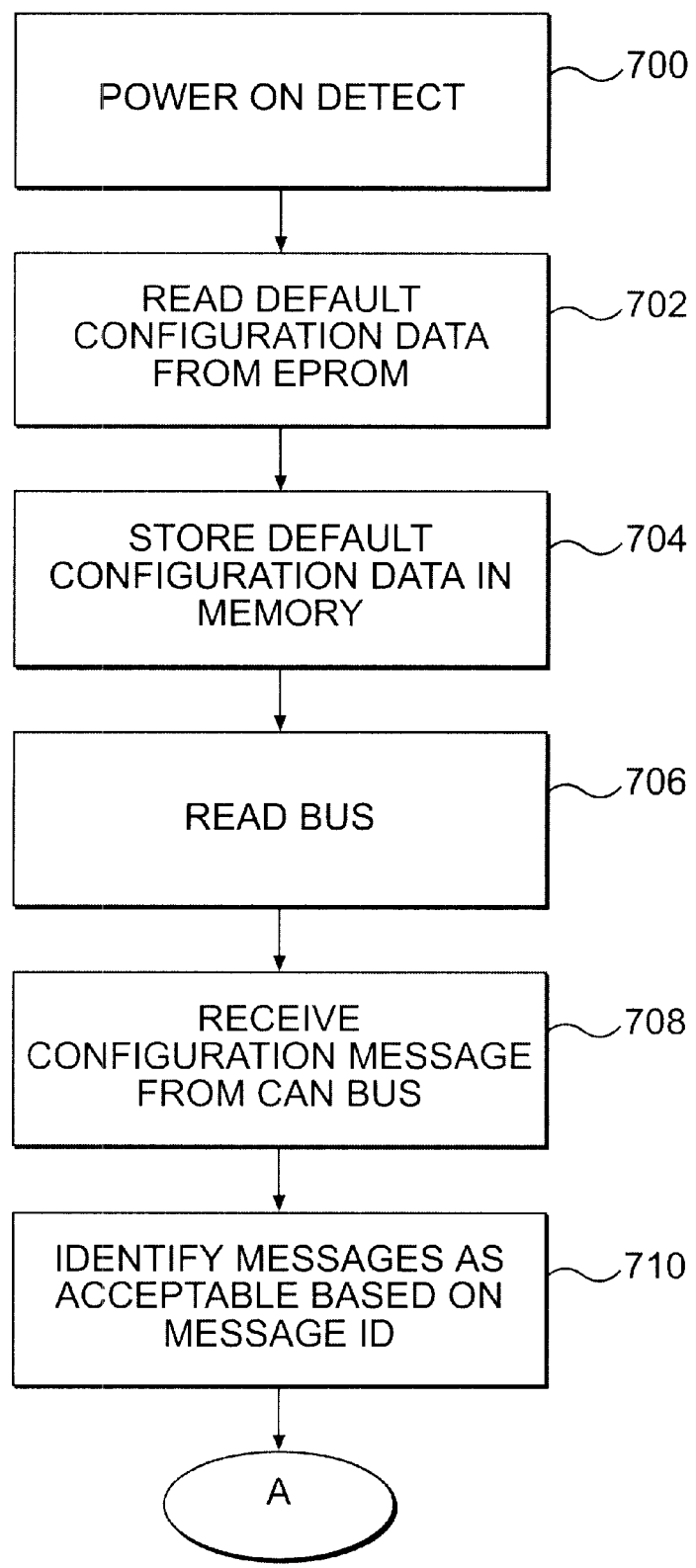
FIGS. 7A and 7B depict a method of installing a default configuration and a modified configuration into a device over a message-based bus according to an embodiment of the present invention.
Figure 7B:
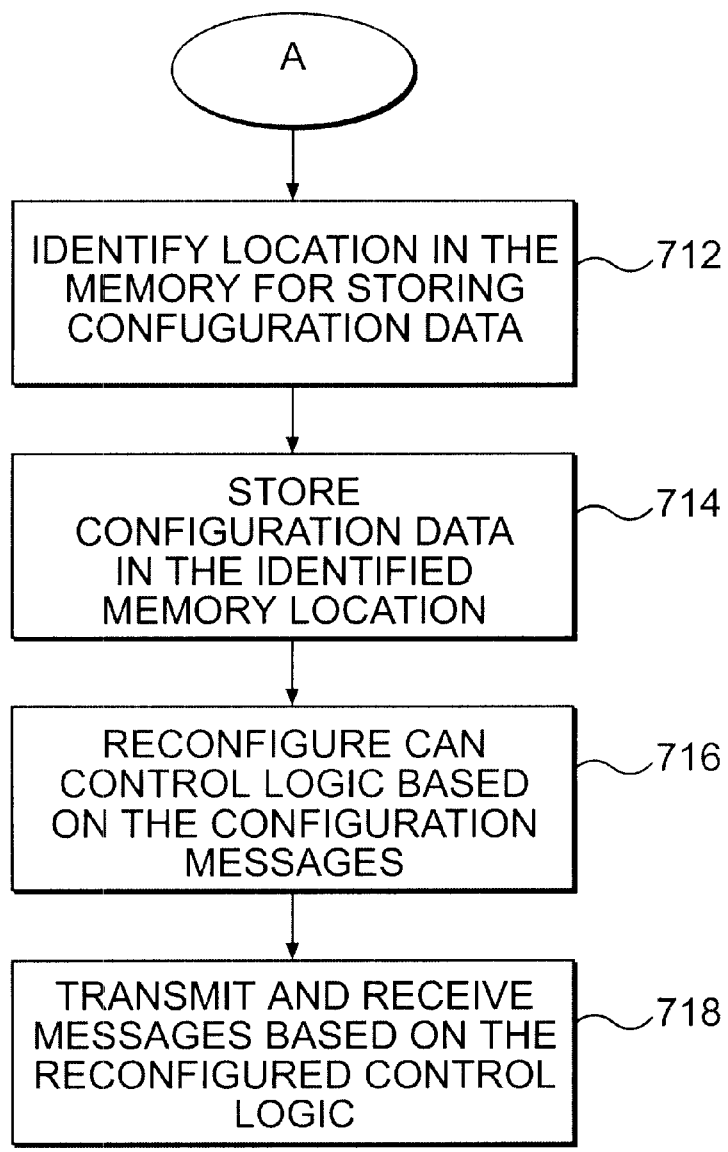

FIG. 7 depicts a method of configuring a device according to the present invention. Referring to FIG. 7, in step 700 power applied to a device is detected. In step 702, configuration data from an EPROM is read. In step 704, configuration data from the EPROM is stored in a volatile memory. Steps 700–704 result in installing at power up a default configuration that controls the operation of the device. The device may then function within a message-based network to exchange messages with the bus and process the messages. Once the default configuration is written to the memory, it becomes an alterable configuration.

In step 706, the device reads the bus. In step 708, the device receives a configuration message from the bus. In step 710, the device identifies the message ID of the configuration message as being acceptable. If the message ID is not acceptable or recognized, the device will not process the message. In step 712, the device identifies the accepted message as a configuration message and determines the location within the memory of the device that needs to be written by values within the configuration message. This step may be performed based on the message ID and/or other bits within the configuration message. In step 714, the device stores configuration data in the configuration register of the memory identified in the configuration message. In step 716, the modified configuration/control register value is read by one or more modules within the device, such as modules 402–416 of the SLIO embodiment. This causes modified operation of each affected module according to the desired configuration. In step 718, the device transmits and receives messages based on the reconfigured configuration/control registers 718.

In-Line Serial Programming

Figure 12:
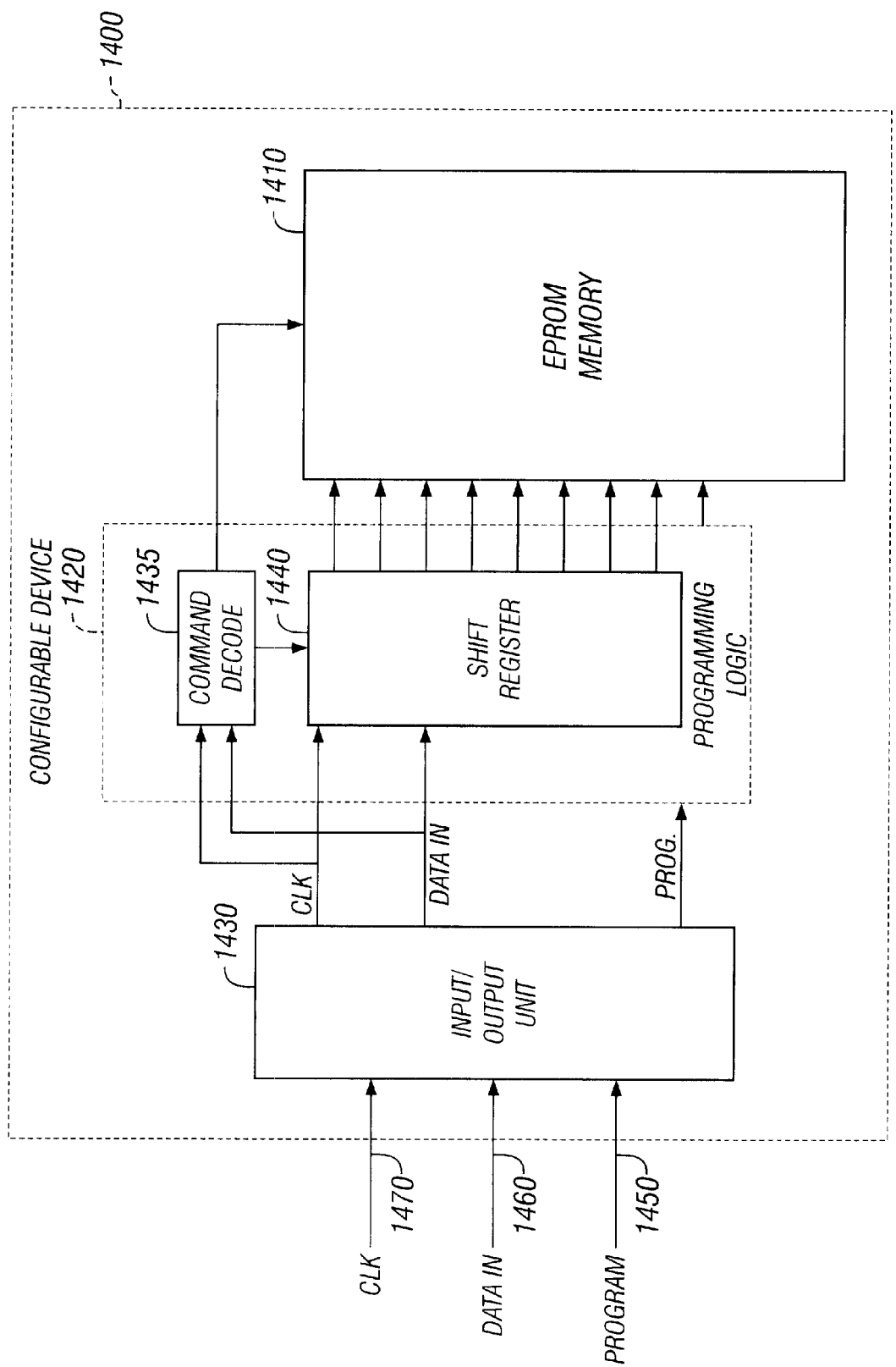
FIG. 12 depicts a functional block diagram of elements within a configurable device used for serial programming of the default configuration into an EPROM of the device according to an embodiment of the present invention.

FIG. 12 depicts a block diagram of relevant portions of a device 1400 used in programming a default configuration into an EPROM memory 1410 according to an embodiment of the present invention. The device 1400, in the preferred embodiment, is a device within a node 104, such as a SLIO or a microcontroller, coupled to a message-based bus such as the CAN bus. According to the present invention, the device 1400 may be programmed with the default configuration while implemented within a system in a process called in-line serial programming. Further according to the present invention, three input signals are used to initiate programming: a clock signal, a data signal and a programming voltage signal. In normal operating modes, these input signals may be reconfigured for normal operation. During programming mode, application of the programming voltage signal, which is typically greater than the voltage of the power signal applied to the device, puts the device in programming mode. The programming voltage may be, for example, 12.5 volts. The power signal for the device may be, for example, 3.3 or 5 volts. It will be understood, however, that any programming voltage (above or below 12.5 volts) or any power level for the device may be chosen consistent with the operating requirements of the device.

Referring to FIG. 12, the configurable device 1400 includes an EPROM memory 1410, programming logic 1420 and an input/output unit 1430. The input/output unit 1430 includes pins for connecting the configurable device to a system. The input/output unit also includes logic for configuring a portion of the pins to operate in both a normal mode and in a programming mode. This is advantageous in that it eliminates the need for the device 1400 to have separate input/output pins for programming the device. Rather, according to an embodiment of the present invention, pins for programming the device are also used for normal input/output signals during normal operation of the device.

In general, it is preferred to have fewer pins devoted to the programming function. In a preferred embodiment of the invention, three pins are used, a clock pin, a data pin and a programming pin. The programming pin receives the programming voltage to initiate the programming mode. The clock pin receives a clock signal used by the programmer to clock data and commands into the device for programming. The data pin is used to convey data which may include data and commands into the device 1400. It will be understood that additional pins may be devoted to the programming mode. For example, more data pins may be used to effect parallel transfer of data, rather than serial transfer of data, into the device 1400.

To initiate a programming cycle, the programming voltage signal is raised to the programming voltage level. The clock and data signals may also be held at logic zero during the transition in the programming voltage signal. This causes logic in the input/output unit 1430 (or any other convenient module) to detect the programming mode and activate a programming mode signal. The logic in the input/output unit detecting the programming mode may include an inverter or other logic element coupled to the program pin that has a switching threshold set higher than the voltage level of the power source. Thus, the inverter never activates the programming mode signal unless the programming voltage signal is applied to the programming pin and the voltage of the programming signal exceeds the switching threshold.

The programming mode signal is conveyed to the programming logic 1420. This activates the programming logic 1420. The programming logic receives signals based on the clock and data programming signals and determines commands and data based on these signals. For example, to identify and perform various commands, such as reading a location within the EPROM 1410 or programming the location, data is entered serially into a command decode unit 1435 which may include a latch for storing, for example, a three bit command. The command decode unit 1435 receives, stores and decodes commands to control the operation of a shift register 1440 within the programming logic 1420.

In a preferred embodiment of serial programming, the command decode unit 1435 recognizes that the first six pulses of the clock signal are for entering commands. However, only three of those data bits are loaded into the command shift register within the command decode unit 1435. The first pulse is a start pulse, pulses 2–4 are for data, pulse 5 is an execution pulse, and pulse 6 is either a stop pulse or a "don't care" pulse. Once the command is stored in the command decode unit 1435, the command decode unit 1435 determines whether the command is an instruction for programming data into the EPROM memory 1410. If so, additional data bits are clocked into the device 1400 in sequential clock pulses and stored into the shift register 1440. Each data bit enters one side of the shift register and proceeds sequentially with each clock pulse along the shift register until clock pulses cease to be applied to the shift register. In this manner, the shift register may be filled from a serial data stream. The shift register generally includes the same number of bits as the width of a bus connecting the shift register 1440 to a memory array of the EPROM memory. In a preferred embodiment, the EPROM memory is a 1K×14 memory and the shift register includes 14 bits. It will be understood, however, that any size and width EPROM and shift register may be used.

Once a command has been received and executed by the programming logic to store data into the shift register 1440, another command may be entered to initiate programming the EPROM memory 1410 based on data from the shift register 1440. When that command is decoded, all fourteen bits in the shift register 1440 are written in parallel into the EPROM memory 1410. For a read instruction, the fourteen bits are read in parallel out of the EPROM memory into the shift register 1440. The read data may then be serially shifted out of the shift register and out the data pin 1460 to a programming monitor. The read instruction is typically used in programming mode to determine whether programming worked or if additional attempts to program a particular memory location should be made.

It should be noted that during programming mode, the programming voltage signal may be applied to the memory array of the EPROM memory 1410 to cause memory locations to be written. This may be accomplished by the programming logic decoding an address of the location to be written and raising a word line for the location to the programming voltage. The data may then be written into that location from the shift register 1440.

The data serially written into the EPROM memory 1410 is data specifying a default configuration of the device. The default configuration may be programmed into the device during manufacture of the device 1400. Alternatively, according to an embodiment of the present invention, the default configuration may be programmed into the device while the device is physically connected to a system. This is called in-line serial programming.

To accomplish in-line serial programming, the device is attached to the system prior to programming the device with the default configuration. The device 1400 is then programmed while it is attached to the system. This permits the device 1400 to be programmed at the last possible moment before actual operation of the device within the system. Many system designers may require the flexibility to make last-minute configuration changes that this feature affords.

In order to program the device 1400 while attached to the system without damaging other devices within the system and without having other devices interfere with programming, the pins of the device 1400 used for programming are isolated from other devices during programming. Typically, the isolation is effected by inserting resistors between the pins of the device 1400 used for programming and other devices. The resistors may be hard-wired or switchably connected so that the resistors may be switched in during programming and switched out for normal operation. In other embodiments, the isolation circuitry may be a switch that switchably connects the programming pins of the device 1400 to the system. The switch may be opened during programming so that the programming signals are only applied to the programming pins of the device 1400.

For programming the device while in the system, the system generally includes ports that are connected directly to the programming pins. Programming signals are applied to the ports of the system which are in turn conveyed, for example, from a respective port to the clock, data and program pins of the device 1400. The path from each port to a pin on the device 1400 is isolated from the rest of the system as described above to prevent malfunction of programming or of other elements in the system. The path from each port to a pin, however, may incorporate one or more resistors, capacitors, inductors or other elements to, for example, limit peak current or adjust a voltage level or signal characteristic of each signal as desired.

The EPROM 1410 undergoing programming may be erasable either electrically or via UV. In the latter configuration, the EPROM is generally packaged using a clear window over the memory array of the EPROM 1410 to permit application of UV light to erase the array.

Programmable A/D Conversion

Figure 8:
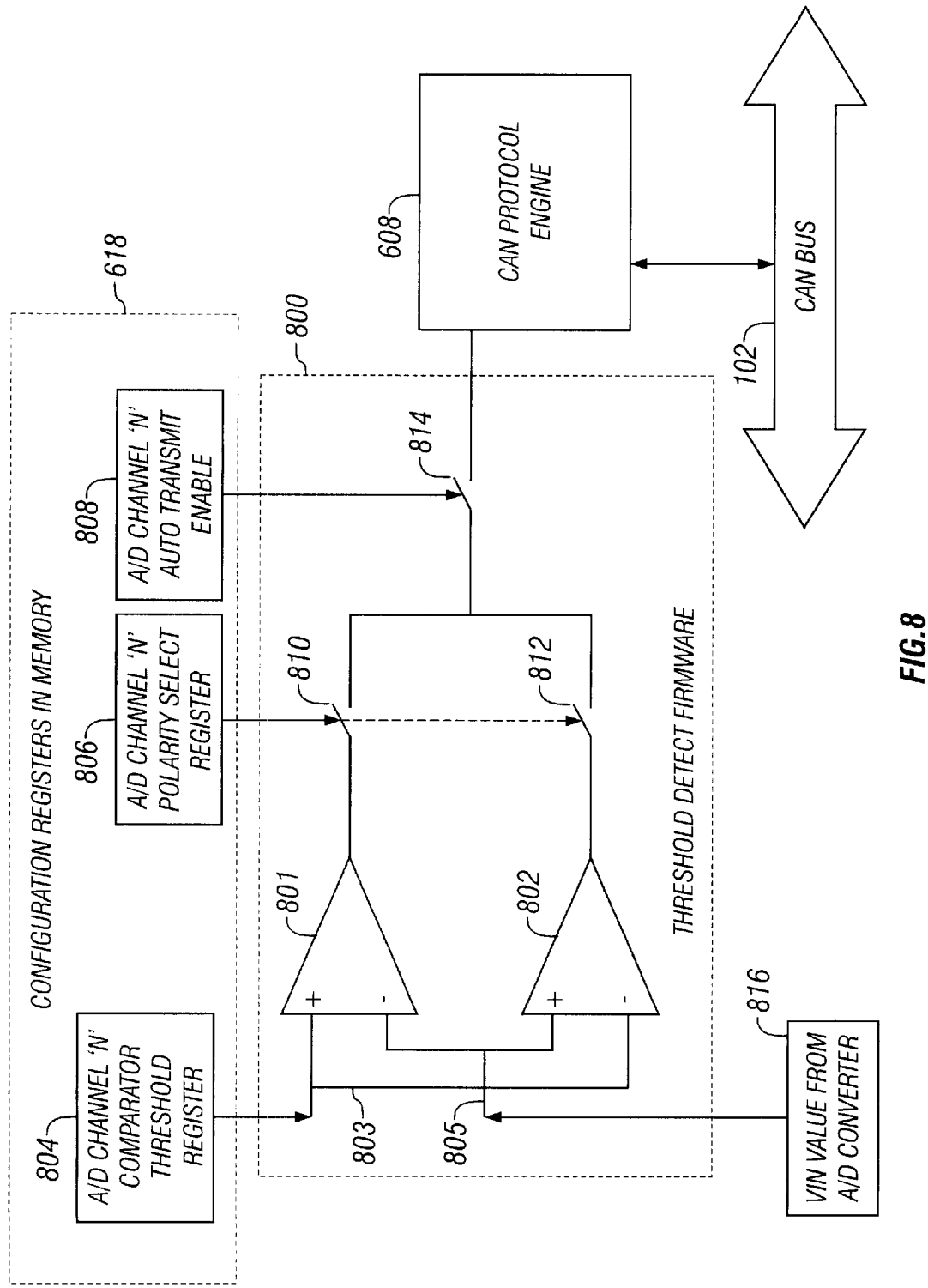
FIG. 8 depicts an internal view of a device having an A/D converter equipped for automatic message transmission according to an embodiment of the present invention.

FIG. 8 depicts a functional view of an embodiment of an enhanced A/D conversion function according to the present invention. The enhanced functionality allows an A/D converter within a device coupled to a message-based bus to be configured to: a) set threshold levels; b) determine whether an analog input signal exceeds (or is less than) the threshold level; and c) automatically transmit a data message over a message-based bus such as the CAN bus 102 when the analog input signal exceeds (or is less than) the threshold level. This enhanced functionality facilitates monitoring analog input channels and may be implemented on simple or complex devices. In CAN devices, it may reduce message traffic on the message-based bus that would otherwise be required to monitor the analog input levels.

Referring to FIG. 8, the threshold detect firmware 800 communicates with configuration registers 618 in the memory 606 and the CAN protocol engine 608. The threshold detect firmware 800 includes two digital comparators 801 and 802. The digital comparators 801 and 802 each have positive and negative terminals. The positive terminal of comparator 801 is coupled to the negative terminal of comparator 802 over line 803 which is also coupled to the comparator threshold register 804. The comparator threshold register 804 stores a threshold value for each of N analog input channels. The threshold value represents a threshold amplitude of a voltage corresponding one of N analog input channels. The threshold value is chosen to flag a condition where the digital output of a converted analog input signal rises above or below the threshold value. The negative terminal of the comparator 801 is coupled to the positive terminal of comparator 802 over line 805 which is also coupled to a conversion value 816 from the A/D conversion. The conversion value 816 is a digital number representing the analog voltage on one of the N analog input channels as determined by the A/D converter 416.

The outputs of the digital comparators 801 and 802 are coupled respectively to switches 810 and 812. The switches are controlled by a polarity select register 806 and selectively convey comparator outputs based on the polarity value. The polarity select register may store one bit per N A/D channels. Each bit selects one or the other of the switches 810 and 812 based on its value. The polarity select register 806 controls for each of N channels whether to automatically transmit messages when the conversion value 816 from the A/D converter 416 is above or below the value set in the comparator threshold register 804.

The output of switches 810 and 812 are coupled together and to a switch 814. The switch 814 is controlled by an auto transmit enable register 808. The auto transmit enable register 808 may include a single bit for each of N analog input channels. It controls whether to enable or disable automatic transmission of data messages on each channel. If the auto transmit enable register bit is enabled for a channel, the device will automatically transmit at least one data message over the CAN bus 102 (or other message-based bus) via the CAN protocol engine 608 when the conditions are met. The conditions are met, for example, when an analog input signal rises above or below, depending on a polarity within the polarity select register 806, a threshold level set by the comparator threshold register 804. If the auto transmit enable register bit is disabled for a channel, the device will not automatically transmit data messages over the bus 102, even if the conditions are met.

It will be understood that the comparators 801 and 802 and the switches 810–802 and the switches 810–814 are preferably implemented in firmware associated with the processing/control unit 406 or the A/D converter 416.

During operation, a device is coupled to one or more analog input channels and to the CAN bus 102. The configuration may resemble, for example, the connections between the SLIO device 302 and the temperature transducers depicted in FIG. 4. Each of the temperature transducers provide an analog input signal to inputs of the SLIO 302. The analog input signals become inputs to the threshold detect firmware 800. According to the present invention, the comparator threshold register 804, the polarity select register 806 and the auto transmit enable register 808 are used to set temperatures above or below which the SLIO device 302 will automatically transmit one or more data messages over the bus 102. This feature incorporates control functionality into the node and has the effect of reducing traffic on the CAN bus. This is because the SLIO 302 may not need to continuously broadcast data messages with current readings. Rather, the readings may only be important to other nodes within the network if the temperature is above or below a certain threshold. For example, in the case of the radiator temperature, the temperature reading may not be important unless it is above 200 degrees. Above this level, a warning light may need to be illuminated. According to the embodiment of FIG. 8, 200 degrees may be programmed into the comparator threshold register 804 and a positive polarity bit may be programmed into the polarity select register. This configuration would allow automatic transmission of data messages with the temperature of the radiator should the temperature of the analog input corresponding to the radiator rise above 200 degrees.

Figure 9:
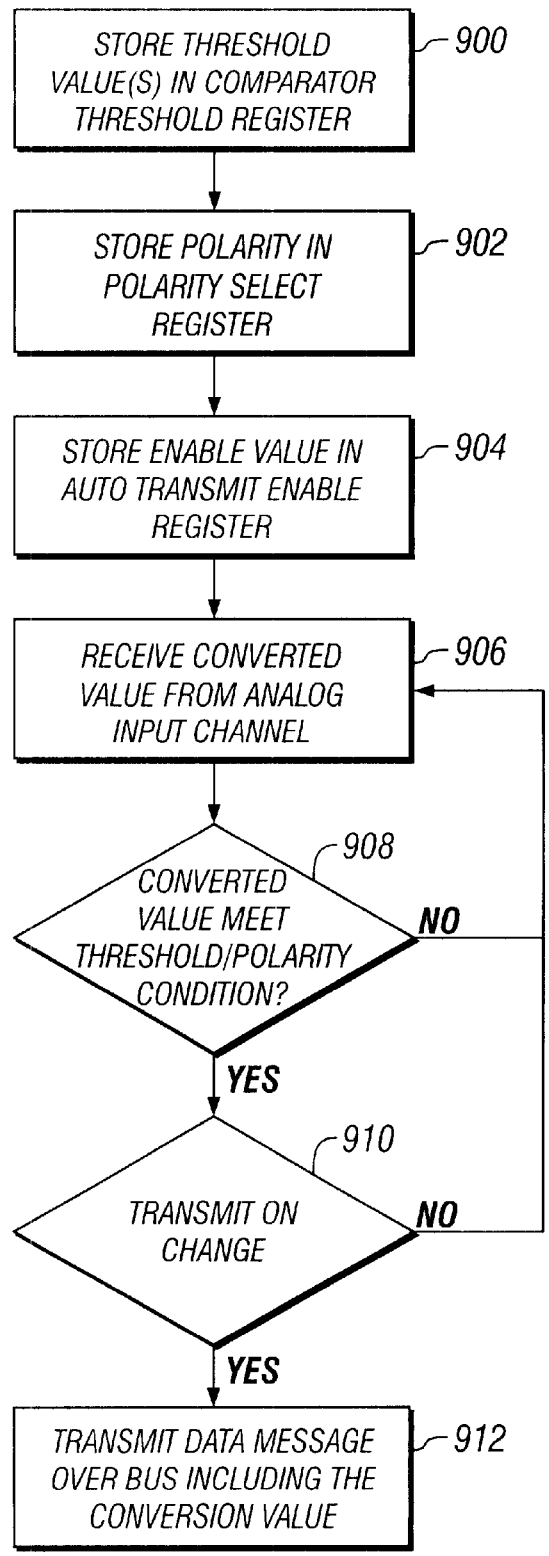
FIG. 9 depicts a method of automatic message transmission in response to an analog input exceeding a threshold value according to an embodiment of the present invention.

A method according to the present invention is illustrated in FIG. 9. Referring to FIG. 9, in step 900, threshold values are stored in the comparator threshold register 804. Typically, one value is stored for each analog input channel. However, in illustrative variations there may be only a single value for all input channels or multiple values for each input channel. In step 902, polarity bits are stored in the polarity select register 806. Typically there is one bit per analog input channel to specify whether a conversion value greater than or less than the threshold value is important. In illustrative variations, however, there may be more than one polarity bit per analog input channel each associated with, for example, a threshold value of the input channel.

In step 904, an enable bit is stored in the auto transmit enable register 808. There is typically one enable bit stored for each analog input channel. However, in illustrative variations there may be more than one enable bit per input channel, each associated with a corresponding threshold value.

In step 906, the threshold detect firmware 800 receives a converted value from an analog input channel. In step 908, the firmware determines whether the converted value meets the threshold and polarity condition. This is performed by the comparators 801 and 802 comparing the converted value with the threshold value and forwarding signals based on the polarity bit to the auto transmit enable switch. If the condition is not met, then step 906 begins again when another converted value is received from an input channel. If the condition is met, then step 910 begins. In step 910, if the auto transmit enable bit is not set, then step 906 begins again. If the auto transmit enable bit is set, then the auto transmit enable switch forwards a signal to the CAN protocol engine 608 to automatically transmit a data message to the bus.

In step 912, the CAN protocol engine transmits a data message to the CAN bus. The data message includes a message ID corresponding to the analog input channel that produced the automatic transmit message. In addition, the data message includes as data the conversion value of the analog input signal that triggered the automatic message transmission.

Programmable A/D Auto-Conversion

Figure 10:
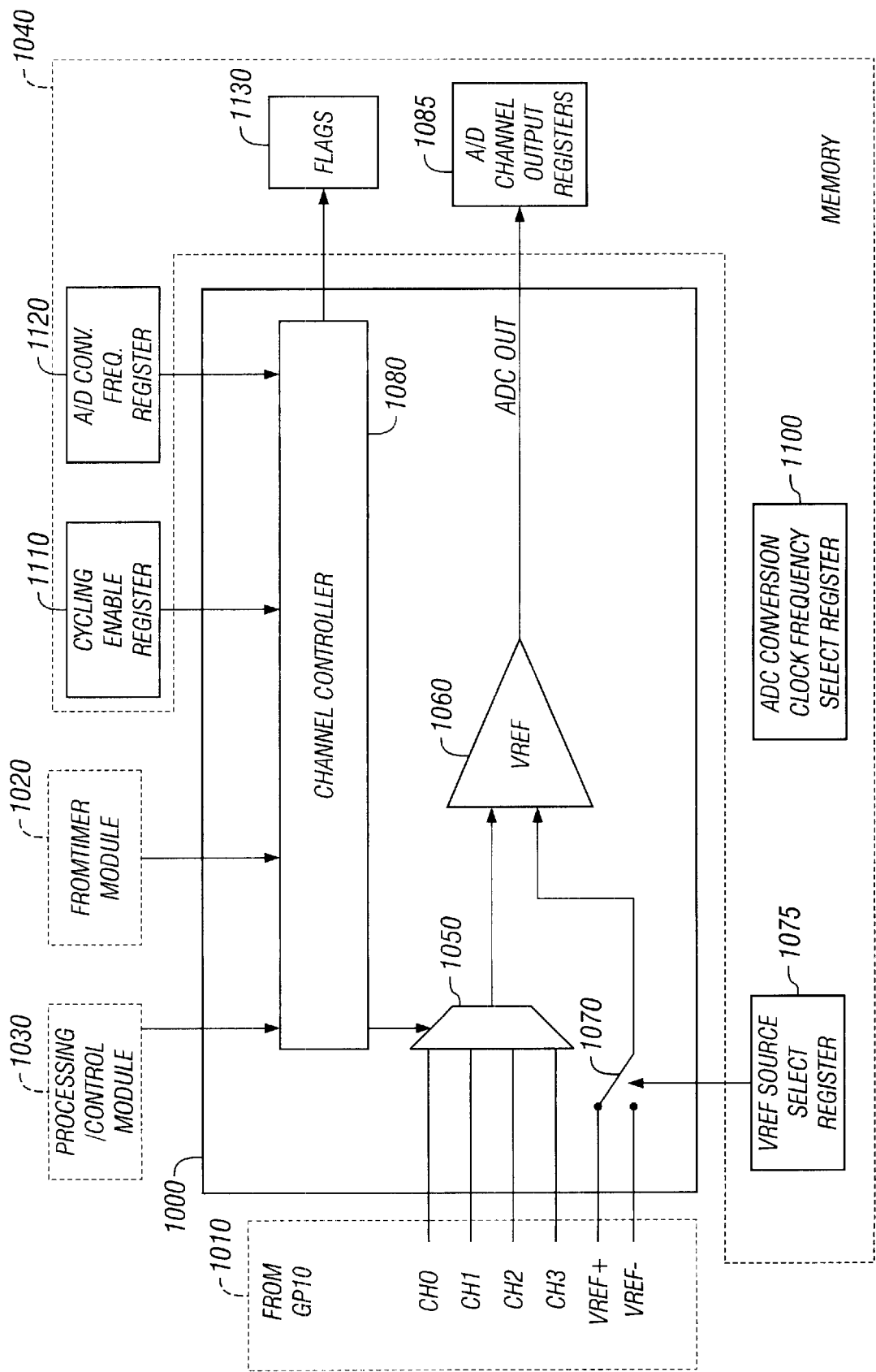
FIG. 10 depicts an internal view of a device for autoconversion of a plurality of analog input channels according to an embodiment of the present invention.

FIG. 10 depicts a functional view of an A/D conversion module 1000 according to an embodiment of the present invention. In this embodiment, many analog input signals may be time multiplexed and provided as a single input signal to a single A/D conversion circuit. This avoids having to provide multiple A/D conversion circuits on devices requiring conversion of more than one analog input signal and therefore saves power and space. The A/D conversion module 1000 may be implemented in any device including an A/D Converter, an application specific integrated circuit (ASIC) a microcontroller, a microprocessor or any other device. FIG. 10 presents the A/D conversion module in a preferred embodiment—interfacing with modules characteristic of the SLIO device described with reference to FIG. 5. It will be understood that the A/D conversion module, however, may be implemented on virtually device as described above.

Referring to FIG. 10, the A/D conversion module 1000 is coupled to the GPIO module 1010, the timer module 1020, the processing and control module 1030 and the memory 1040. The A/D conversion module may also be coupled to other modules within a device including, for example, those modules shown in FIG. 5 as part of the SLIO device. The A/D module 1000 includes a time division multiplexer 1050, an A/D conversion circuit 1060, a Vref switch 1070 and a channel controller 1080. In a preferred embodiment, the A/D conversion circuit is a 12-bit successive approximation A/D converter that allows conversion of an analog input signal to a corresponding 12-bit number. Four analog input channels are received from the GPIO module 1010 and are time multiplexed by the multiplexor 105 0 into a single analog input to the A/D conversion circuit 1060. Voltage references Vref+ and Vref− sources may be brought into the A/D conversion module 1000 from the GPIO module 1010.

The A/D module 1000 has associated with it registers in the memory 1040 for controlling and configuring its operation. For example, the Vref source select register 1075 stores a value that controls the switch 1070 and determines which Vref signal to apply to a single Vref input of the A/D conversion circuit 1060. The A/D conversion circuit 1060 then converts the selected analog input signal based on the applied Vref signal and outputs a conversion value to output registers 1085 in the memory 1040. There may be many A/D channel registers to store and/or buffer results for specific analog channels. In a preferred embodiment, there are six A/D channel registers supporting four analog channels. For each analog channel, a control register such as the cycling enable register 1110 stores bits that configure or control the mode of operation.

Another register that may control operation of the A/D module is the A/D conversion clock frequency select register 1100. This register may store a value used to divide the clock frequency of the device. An A/D module clock may then be derived, if desired, based on the value stored in the clock frequency select register. The derived clock may be routed to elements within the A/D conversion unit, may be used to control the frequency of A/D conversions, and may be used to determine the period of storing conversion results in registers.

The cycling enable register 1110 stores modes of operation for the A/D conversion unit 1000. There may be more than one mode of operation for each analog input channel. According to one embodiment of the invention, the modes include an auto-conversion mode. This mode may be separately enabled or disabled on an analog input channel by channel basis based on values stored in the cycling enable register 1110. The auto-conversion mode may be selected, for example, by setting a bit in the cycling enable register 1110 to a '1' for a given A/D channel. Conversion is performed, sequentially, for each input channel that has been configured for auto-conversion mode.

Values stored in the cycling enable register 1030 are conveyed to the channel controller 1080 which is in turn coupled to the multiplexer 1050. The channel controller 1080 applies a control signal to the multiplexor 1050 to select which analog input channel passes its signals to the A/D conversion circuit 1060.

In auto-conversion mode, the channel controller 1080 receives a converted signal initiating conversion of enabled input channels. The frequency of the converted signal is programmable and may be stored, for example, in the A/D conversion frequency register 1120 The channel controller 1080 may derive the convert signal itself based on a clock signal and the value stored in the register 1 120. Alternatively, the register 1120 or another register may be used to configure the timer module 1120 to produce a programmable interrupt whenever it is time to read and convert the analog input channels. For example, a timer within the timer module 1120 may be used to increment a counter. The timer may then increment the counter and cause an interrupt on overflow from FFh to 00h, or any other convenient transition, as determined by a programmable value. This interrupt in turn may initiate the auto-conversion sequence.

When the auto-conversion sequence is initiated, the channel controller 1080 causes all analog channels that have been configured for auto conversion in the cycling enable register 1110 to be sampled and converted by the A/D conversion circuit 1060. This may be accomplished using a counter within the channel controller 1080 to increment control bits applied to the multiplexer 1050 on successive clock cycles. The counter may cycle from 0 to x where x−1 is the number of analog input channels. Control logic may further be implemented in a well known manner in the channel controller to, for example, skip channels that are not enabled or not store conversion values in output registers for channels that are not enabled.

After the conversion has been completed for each enabled channel, a digital value corresponding to the amplitude of the analog signal is stored in channel output registers 1085 for the respective channel. When an auto-conversion cycle has completed, the channel controller may write a value in a flag register 1130 in the memory 1090. The processing/control module 1030 may determine when an auto-conversion cycle is complete by monitoring flag register 1130 in the memory 1040. The flag value may be used by any device in which the A/D conversion module resides to initiate, for example, an output or conditional output of the converted value. The A/D conversion results are, accordingly, automatically transmitted over the bus 102.

Another mode of A/D conversion is the conversion-on-request mode. It may be selected by setting one of the cycling enable register 1110 bits to a '0' for a given A/D channel. In the conversion-on-request mode, the device performs an A/D conversion only after receiving a request to convert the input channels. The request may be initiated within the device or by another device. The request may be, for example, a "Read A/D Registers" information request message received from a message-based bus such as the CAN bus. In this case, one or more of the GPIO inputs/outputs 422 that have been configured as analog input channels may be read and converted by the A/D converter 416. Subsequently, the result for each analog channel is stored in a register and outputted as a data message over the CAN bus.

In the preferred embodiment, when a message is received from the CAN bus including an identifier specifying a request conversion message, the processing/control module 1030 sends a conversion request signal to the channel controller. This signal includes data identifying one or more analog input channel for reading. The channel controller 1080 receives the data and may cause either: a) identified analog input channels to be converted; b) all of the analog input channels to be converted; or c) only analog input channels whose enable bits are set to the convert on request mode to be converted. Subsequently, the result for each analog channel is stored in a register and outputted as a data message over the CAN bus.

In the auto-conversion mode, once an A/D auto-conversion has been completed, the A/D channel result(s) can be compared to a value stored in the associated A/D channel 'N' comparator threshold registers 804 shown in FIG. 8. If the value in the analog channel result registers is lower or higher than the value in the A/D comparator registers, then a transmit flag in one of the flag registers 1130 may be set. A "transmit on change" message is sent if one or more flags are set in the flag register. The transmit-on-change function for a given analog channel may be enabled by the corresponding bit in the A/D channel 'N' auto transmit enable register 808. If the A/D channel has been enabled for transmit on input change mode, then the device will transmit a message over the message-based bus with the appropriate data. If more than one A/D channel has a change-of-state condition, then a portion of the message may include bits identifying a correlation between each conversion value in the message and each input channel. Alternatively, the bits may simply identify the input channel on which the change occurred.

Figure 11A:
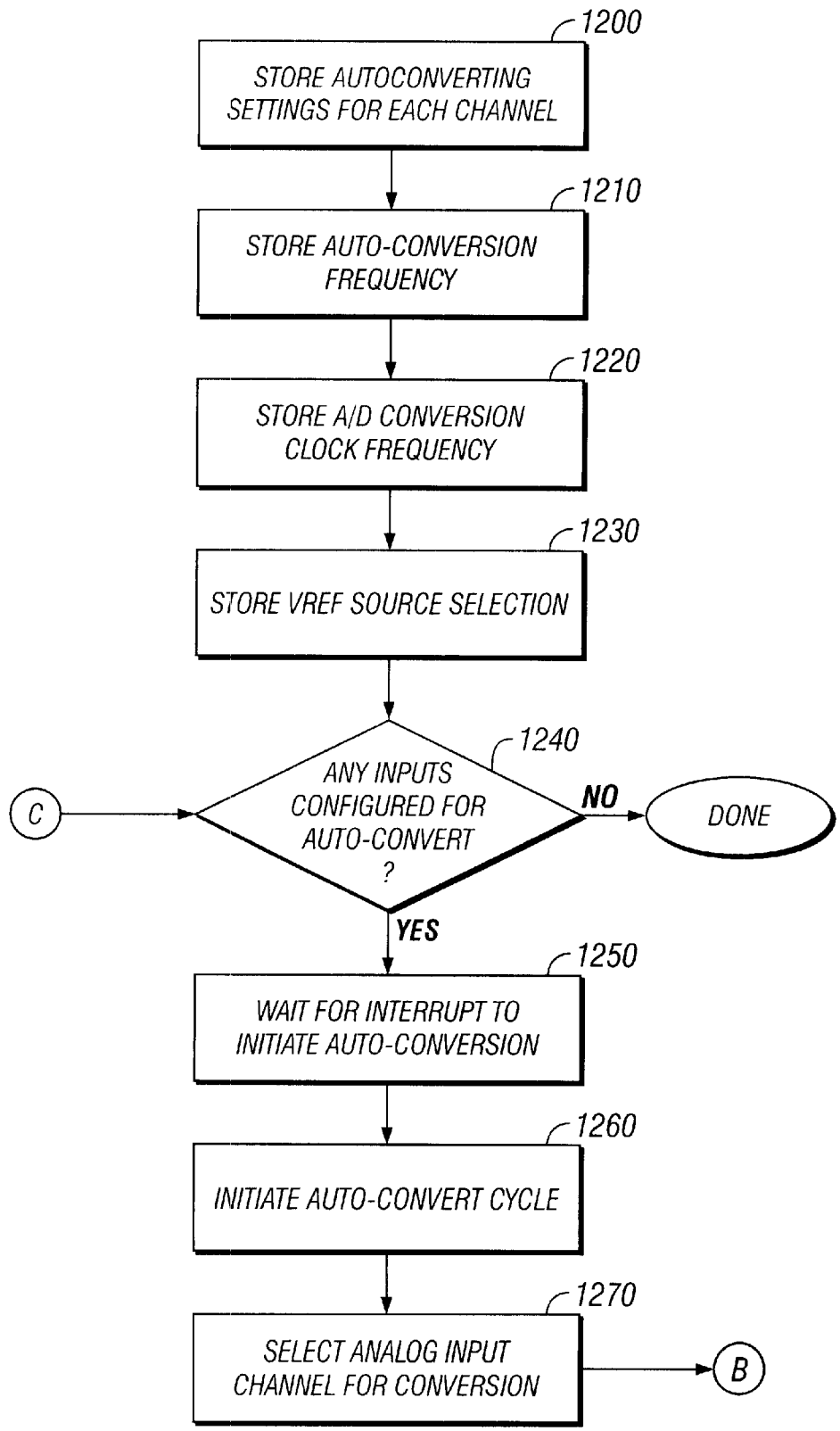
FIGS. 11A and 11B depict a method of automatically converting a plurality of analog input channels according to an embodiment of the present invention.
Figure 11B:
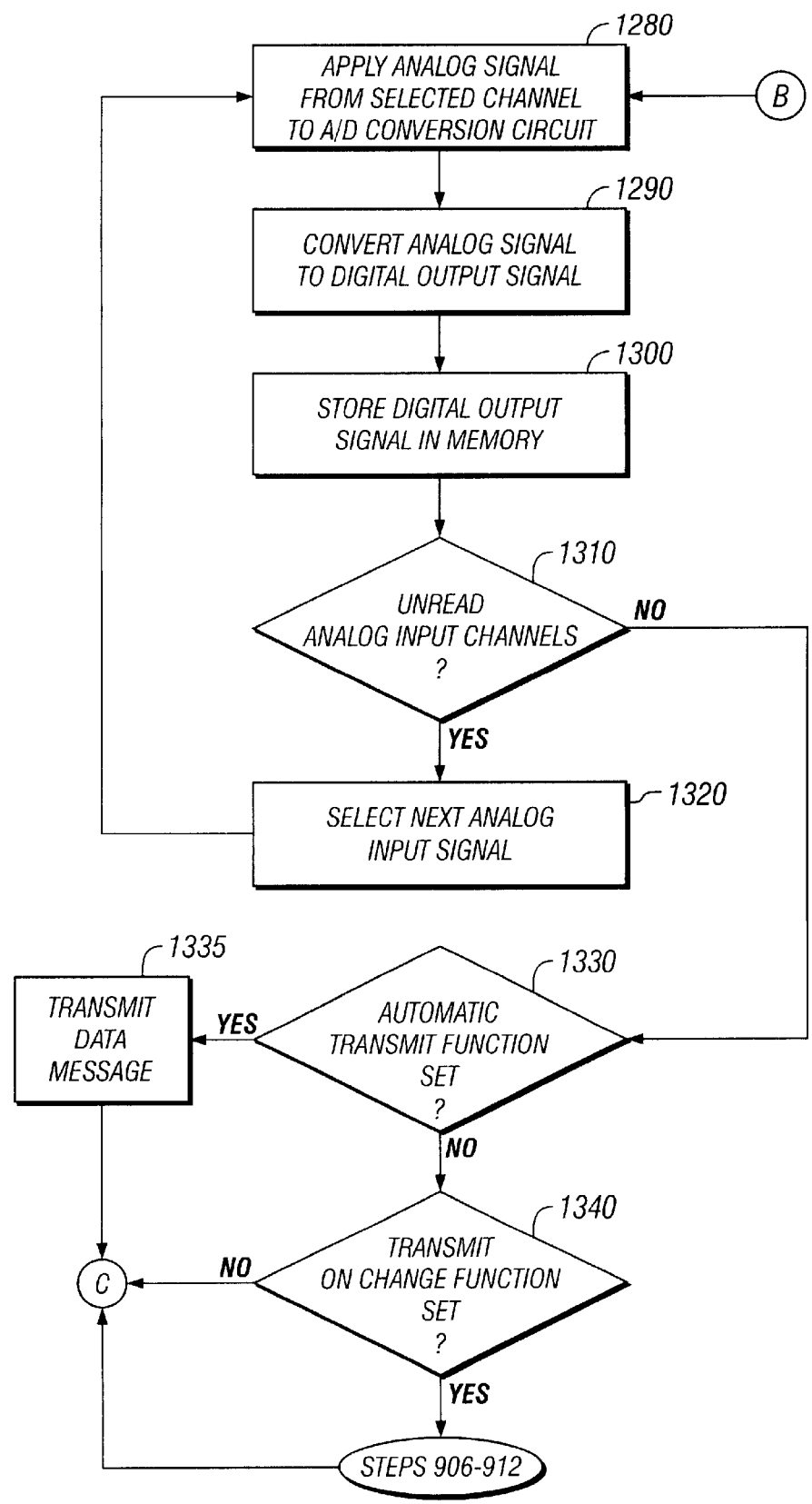

FIGS. 11A and 11B depict a method of auto-converting many analog input signals using fewer A/D conversion circuits than the number of analog input signals according to an embodiment of the present invention. Referring to FIG. 11A, in step 1200 the device stores auto-converting settings for each analog input channel. In general, these settings may indicate whether auto-conversion is enabled or disabled for each channel. In step 1210, the device stores a conversion frequency which is the frequency at which auto-conversion cycles are initiated. In step 1220, the device stores an A/D conversion clock frequency, which may be used to reduce a clock signal of the device by an integer multiple. The clock of reduced frequency sets the frequency at which the A/D conversion module converts signals and stores data. In step 1230, the device stores a Vref source selection value which may be used to select an external voltage reference to bias the A/D conversion circuit 1030. The values stored by the device in steps 1200–1230 may be stored in configurable registers within a memory within the device. The configurable registers may be written by an EPROM at startup and/or re-written by configuration messages received from a message-based bus as described with reference to FIGS. 6–7B.

In step 1240, the device determines whether any of the analog input channels are configured for auto-conversion. If not, then the method terminates. If so, then step 1250 begins. In 1250, the device waits for an interrupt to initiate auto-conversion. This may occur based on the stored auto-conversion frequency and clock cycle transitions. It may also occur based on an output from a timer module. Once an interrupt occurs, in step 1260, the device initiates an auto-convert cycle. In step 1270, the device selects an analog input channel for A/D conversion.

Referring to FIG. 11B, the next step is step 1280. In step 1280, the input signal from the selected analog channel is applied to the A/D conversion circuit 1030. In step 1290, the A/D conversion circuit 1030 converts the analog input signal applied at its input to a converted value that is output as a digital signal. In step 1300, the converted value is stored in memory of the device. In step 1310, the device determines whether any analog input channels remain unread. If so, in step 1300, the next analog input channel is selected and then step 1280 begins again. If not, step 1330 or step 1340 begins depending on the device configuration.

If the device is configured to transmit data messages over the message-based bus automatically upon completion of the auto-convert cycle in step 1330, then step 1335 begins and a data message is transmitted over a message-based bus such as the CAN bus. The data message may include the conversion values corresponding to each analog input channel which is enabled for auto-conversion. Alternatively, individual data messages may be sent for each channel.

If the device is not configured for automatic transmission in step 1330, then step 1340 begins. If the device is configured with the transmit on change function enabled, as determined by step 1340, then steps 906–912 begin to determine if the converted value has crossed a threshold set in the A/D channel 'N' comparator threshold register for each channel. If not, then no data message is transmitted. After completing any of steps: 1330; 1340; or 906–912, step 1240 begins again and the device waits to begin another auto-convert cycle.

While specific embodiments of the present invention have been described, it will be understood by those having ordinary skill in the art that changes may be made to those embodiments without departing from the spirit and scope of the invention. As used herein, the term register is used to mean a location for storing data within a memory, regardless of how the memory is implemented. The term memory is intended to include all techniques for storing data, including storing data in latches, memory cells of memory such as dynamic or static random access memory, EPROM memory, EEPROM memory, flash memory, as well as in magnetic media and optically readable media.

What is claimed is:

1. A device for automatically converting a plurality of analog input channels, comprising:

a multiplexer having at least two analog input channels, at least one control input and an output;

an analog to digital conversion circuit, having inputs coupled to the output of the multiplexer and a clock signal and outputting a conversion value based on a voltage associated with the output of the multiplexer in successive clock cycles; and a configurable channel controller outputting a control signal to the at least one control input of the multiplexer to automatically select successive ones of the at least two analog input channels for conveying to the analog to digital conversion circuit;

wherein each of the at least two analog input channels is selectively enabled for auto-conversion based on some of the values.

2. The analog to digital converter according to claim 1, wherein a configuration of the configurable channel controller is set based on values stored in at least one register.

3. The analog to digital converter according to claim 1, wherein the configurable channel controller receives an interrupt signal to initiate outputting the control signal.

4. The analog to digital converter according to claim 1, wherein the configurable controller generates an interrupt signal to initiate outputting the control signal.

5. The analog to digital converter according to claim 1, wherein an interrupt signal initiates outputting the control signal and the at least one register stores a frequency value, the frequency value determining the frequency of the interrupt signal.

6. The analog to digital converter according to claim 1, further comprising:

registers for storing the conversion value.

7. The analog to digital converter according to claim 1, wherein the conversion value is output in successive clock cycles to a plurality of registers, each register storing the converted value corresponding to the selected analog input channel.

8. The analog to digital converter according to claim 7, further comprising:

comparators for comparing the converted value with a threshold value; and a protocol engine for outputting a message when the converted value crosses the threshold value.

9. A method of automatic A/D conversion of a plurality of input channels, comprising:

provide at least two analog input channels;

periodically, successively selecting one of the plurality of analog input channels;

applying a signal from the selected analog input channel to an A/D conversion circuit; and converting the signal to a converted value;

wherein at least one register stores a configuration that includes a period value corresponding to a period of the periodically selecting and wherein each of the at least two analog input channels is enabled for the periodically selecting based on enable values of the configuration.

10. The method according to claim 9, wherein an interrupt signal initiates the periodically selecting.

11. The method according to claim 10, further comprising storing the converted value.

12. The method according to claim 9, wherein the converted value is output in successive clock cycles to a plurality of registers, each register storing the converted value corresponding to the selected analog input channel.

13. The method according to claim 11, further comprising comparing the converted value with a threshold value and outputting a message over a message-based bus when the converted value crosses the threshold value.

* * * * *